(12) United States Patent
Watanabe et al.

(10) Patent No.: US 12,354,845 B2
(45) Date of Patent: Jul. 8, 2025

(54) ACTIVE GAS GENERATION APPARATUS

(71) Applicant: TOSHIBA MITSUBISHI-ELECTRIC INDUSTRIAL SYSTEMS CORPORATION, Tokyo (JP)

(72) Inventors: Kensuke Watanabe, Tokyo (JP); Ren Arita, Tokyo (JP)

(73) Assignee: TMEIC CORPORATION, Tokyo (JP)

( * ) Notice: Subject to any disclaimer, the term of this patent is extended or adjusted under 35 U.S.C. 154(b) by 0 days.

(21) Appl. No.: 18/270,235

(22) PCT Filed: Dec. 8, 2021

(86) PCT No.: PCT/JP2021/045129
§ 371 (c)(1),
(2) Date: Jun. 29, 2023

(87) PCT Pub. No.: WO2023/105682
PCT Pub. Date: Jun. 15, 2023

(65) Prior Publication Data
US 2024/0062994 A1 Feb. 22, 2024

(51) Int. Cl.
*H01J 37/32* (2006.01)

(52) U.S. Cl.
CPC ............ *H01J 37/32541* (2013.01); *H01J 37/32348* (2013.01); *H01J 37/3244* (2013.01); *H01J 37/3255* (2013.01); *H01J 2237/327* (2013.01)

(58) Field of Classification Search
CPC .......... H01J 37/32541; H01J 37/32348; H01J 37/3244; H01J 37/3255; H01J 2237/327;
(Continued)

(56) References Cited

U.S. PATENT DOCUMENTS

2004/0238124 A1* 12/2004 Nakamura ........ H01J 37/32541
156/345.43
2005/0016457 A1* 1/2005 Kawasaki ........... H01J 37/3244
118/723 E
(Continued)

FOREIGN PATENT DOCUMENTS

CN 103261477 A * 8/2013 ............. C23C 14/50
CN 109477220 B * 2/2021 ............. C01B 13/11
(Continued)

OTHER PUBLICATIONS

International Search Report and Written Opinion mailed on Feb. 22, 2022, received for PCT Application PCT/JP2021/045129, filed on Dec. 8, 2021, 11 pages including English Translation.

*Primary Examiner* — Abdullah A Riyami
*Assistant Examiner* — Syed M Kaiser
(74) *Attorney, Agent, or Firm* — XSENSUS LLP

(57) ABSTRACT

One direction discharge structure in an active gas generation apparatus satisfies arrangement conditions (a) to (c). The condition (a) is a condition that a region where a corresponding metal electrode and a corresponding metal electrode are overlapped with each other in a plan view serves as a corresponding discharge space in a corresponding gap region. The condition (b) is a condition that the corresponding gap region and a plurality of gas supply holes provided in a corresponding gas supply region are overlapped with each other in a plan view. The condition (c) is a condition that the plurality of gas supply holes provided in the corresponding gas supply region and a plurality of gas ejection holes provided below the corresponding gap region sandwich the corresponding discharge space in a plan view, and are disposed to face each other on a one-to-one basis along a Y direction.

9 Claims, 16 Drawing Sheets

(58) Field of Classification Search
CPC ............. H01J 37/32715; C23C 16/452; C23C 16/509; H05H 1/24; H05H 1/2437
See application file for complete search history.

(56) References Cited

U.S. PATENT DOCUMENTS

2019/0088519 A1\* 3/2019 Cho .................. H01L 21/67103
2019/0088520 A1\* 3/2019 Kraus ............... H01J 37/32568

FOREIGN PATENT DOCUMENTS

| | | | | |
|---|---|---|---|---|
| JP | 2009302205 A | \* | 12/2009 | ........ H01J 37/32192 |
| JP | 5328685 B2 | | 10/2013 | |
| JP | 6719856 B2 | | 7/2020 | |
| WO | WO-2021109814 A1 | \* | 6/2021 | ............. C23C 16/26 |

\* cited by examiner

ACTIVE GAS GENERATION APPARATUS

CROSS-REFERENCE TO RELATED APPLICATION

The present application is based on PCT filing PCT/JP2021/045129, filed Dec. 8, 2021, the entire contents of which are incorporated herein by reference.

TECHNICAL FIELD

The present disclosure relates to an active gas generation apparatus generating active gas using parallel plate type dielectric-barrier charge and supplying the active gas to a processing space in a subsequent stage.

BACKGROUND ART

For example, a plasma processing apparatus disclosed in Patent Document 1 or an active gas generation apparatus disclosed in Patent Document 2 is an active gas generation apparatus generating active gas by parallel plate type dielectric-barrier charge.

In a conventional active gas generation apparatus disclosed in Patent Document 1 or Patent Document 2, a processing chamber having a processing space is provided in a subsequent stage of the apparatus.

The conventional active gas generation apparatus generates active gas such as nitrogen radical from material gas such as nitrogen gas using dielectric-barrier discharge, and ejects the active gas into the processing space.

In the plasma processing apparatus disclosed in Patent Document 1, many pores for ejecting active gas are formed in a lower electrode to supply the active gas to a whole surface of a wafer disposed in the processing space.

The active gas generation apparatus disclosed in Patent Document 2 has an improved point that a plurality of gas supply holes provided in a high voltage side electrode constituting part on an upper side and a plurality of gas ejection holes provided in a ground side electrode constituting part on a lower side are disposed not to be overlapped with each other in a plan view. The active gas generation apparatus described above has the improvement point described above, thus can supply the active gas having a relatively uniform radical concentration to the whole surface of the wafer disposed in the processing space.

PRIOR ART DOCUMENTS

Patent Document(s)

Patent Document 1: Japanese Patent No. 5328685
Patent Document 2: Japanese Patent No. 6719856

SUMMARY

Problem to be Solved by the Invention

In the plasma processing apparatus disclosed in Patent Document 1, a staying time in a discharge area is significantly different between plural types of active gas (radical gas) ejected from the plurality of pores. The reason is that the staying time in the discharge area of the plural types of active gas depends on positions of the corresponding pores. Thus, the plasma processing device disclosed in Patent Document 1 has a problem that it is difficult to uniformly eject the active gas having a uniform radical concentration.

In the meanwhile, an object of the conventional active gas generation apparatus disclosed in Patent Document 2 is to solve the problem of the plasma processing device described above.

However, a flow of gas in a space (including the discharge space) sandwiched between the high voltage side electrode constituting part and the ground side electrode constituting part is more complex than normally thought, and the active gas generation apparatus disclosed in Patent Document 2 has a structure that gas may flow in all directions of 360 degrees in a plan view, thus has a problem that such a structure is insufficient to eject the active gas having a uniformized gas concentration.

An object of the present disclosure is to solve the above problems, and provide an active gas generation apparatus capable of uniformly ejecting active gas having an equal radical concentration.

Means to Solve the Problem

An active gas generation apparatus according to the present disclosure is an active gas generation apparatus generating active gas obtained by activating material gas supplied to a discharge space, including: a first electrode constituting part; and a second electrode constituting part provided on a lower side of the first electrode constituting part, wherein the first electrode constituting part includes a first electrode dielectric film and a plurality of first metal electrodes formed on an upper surface of the first electrode dielectric film, the second electrode constituting part includes a second electrode dielectric film and a plurality of second metal electrodes formed on a lower surface of the second electrode dielectric film, alternating voltage is applied to the plurality of first metal electrodes, the plurality of second metal electrodes are set to have reference potential, the first electrode dielectric film includes a plurality of gas supply regions disposed along a first direction, the plurality of gas supply regions include a plurality of gas supply holes at regular intervals along a second direction, the second direction intersects with the first direction, the plurality of first metal electrodes are disposed along the first direction, each of the plurality of first metal electrodes is formed to extend in the second direction, the second electrode dielectric film includes a plurality of discharge area formation regions disposed along the first direction, each the plurality of discharge area formation regions includes a concave region concaved from a surface of the second electrode dielectric film, and is provided to extend in the second direction, a plurality of gas ejection holes are provided on a lower side of each of the plurality of discharge area formation regions, the plurality of gas ejection holes are provided at regular intervals along the second direction, the plurality of second metal electrodes are disposed along the first direction, each of the plurality of second metal electrodes is formed to extend in the second direction, the discharge space includes a plurality of discharge spaces, the plurality of first metal electrodes, the plurality of gas supply regions, the plurality of second metal electrodes, the plurality of discharge area formation regions, and the plurality of discharge spaces correspond to each other on a one-to-one basis, a first metal electrode, a second metal electrode, a gas supply region, a discharge area formation region, and a discharge space corresponding to each other in the plurality of first metal electrodes, the plurality of second metal electrodes, the plurality of gas supply regions, the plurality of discharge area formation regions, and the plurality of discharge spaces are defined as a first corresponding metal electrode, a second corresponding metal electrode, a corresponding gas supply region, a corresponding discharge area formation region, and a corresponding discharge space, respectively, the first corresponding metal electrode, the second corresponding metal electrode, the corresponding gas supply region, the corresponding discharge area formation region, and the corresponding discharge space constitute one direction discharge structure along the second direction, and the one direction discharge structure satisfies arrangement conditions (a) to (c) described hereinafter. (a) A region where the first corresponding metal electrode and the second corresponding metal electrode are overlapped with each other in a plan view constitutes the corresponding discharge space in the corresponding discharge area formation region, (b) the corresponding discharge area formation region and the plurality of gas supply holes provided in the corresponding gas supply region are overlapped with each other in a plan view, and (c) the plurality of gas supply holes provided in the corresponding gas supply region and the plurality of gas ejection holes provided below the corresponding discharge area formation region sandwich the corresponding discharge space in a plan view, and are disposed to face each other on a one-to-one basis along the first direction.

Effects of the Invention

The active gas generation apparatus according to the present disclosure has the one direction discharge structure satisfying the arrangement conditions (a) to (c) described above, thus can eject the active gas having an equal radical concentration from each of the plurality of gas ejection holes in each of the plurality of discharge area formation regions.

Furthermore, the plurality of gas ejection holes in each of the plurality of discharge area formation region are disposed at regular intervals along the second direction, thus the active gas can be uniformly ejected from each of the plurality of gas ejection holes.

As a result, the active gas generation apparatus according to the present disclosure can uniformly eject the active gas having the equal radical concentration from each of all gas ejection holes provided in the plurality of discharge area formation regions.

These and other objects, features, aspects and advantages of the present disclosure will become more apparent from the following detailed description of the present disclosure when taken in conjunction with the accompanying drawings.

DESCRIPTION OF EMBODIMENT(S)

<Problem of Active Gas Generation Apparatus>

Active gas has an extremely short life and is inactivated in a short time, thus the active gas needs to be generated near a processing space where a wafer as a processing target substrate is disposed to blow the active gas to the wafer. The active gas should be uniformly blown to the wafer to keep uniformity of a film laminated on the wafer.

In the dielectric barrier discharge, pressure in a discharge area (discharge space) needs to be increased to a certain level, thus discharge needs to be generated in the other room separated from a processing space (lamination room) where the wafer is disposed.

Under the limitation described above, the active gas generation apparatus is required to uniformly blow the active gas to the wafer.

Performed in the active gas generation apparatus according to the present disclosure is a technical improvement for uniformizing a flow of gas compared with a conventional shape of a discharge area and uniformizing a staying time of gas in a discharge area. As a result, the active gas generation apparatus according to the present disclosure can blow active gas having a constant radical density (radical gas) more equally to a wafer as a processing target substrate.

Embodiment 1

Figure 1:
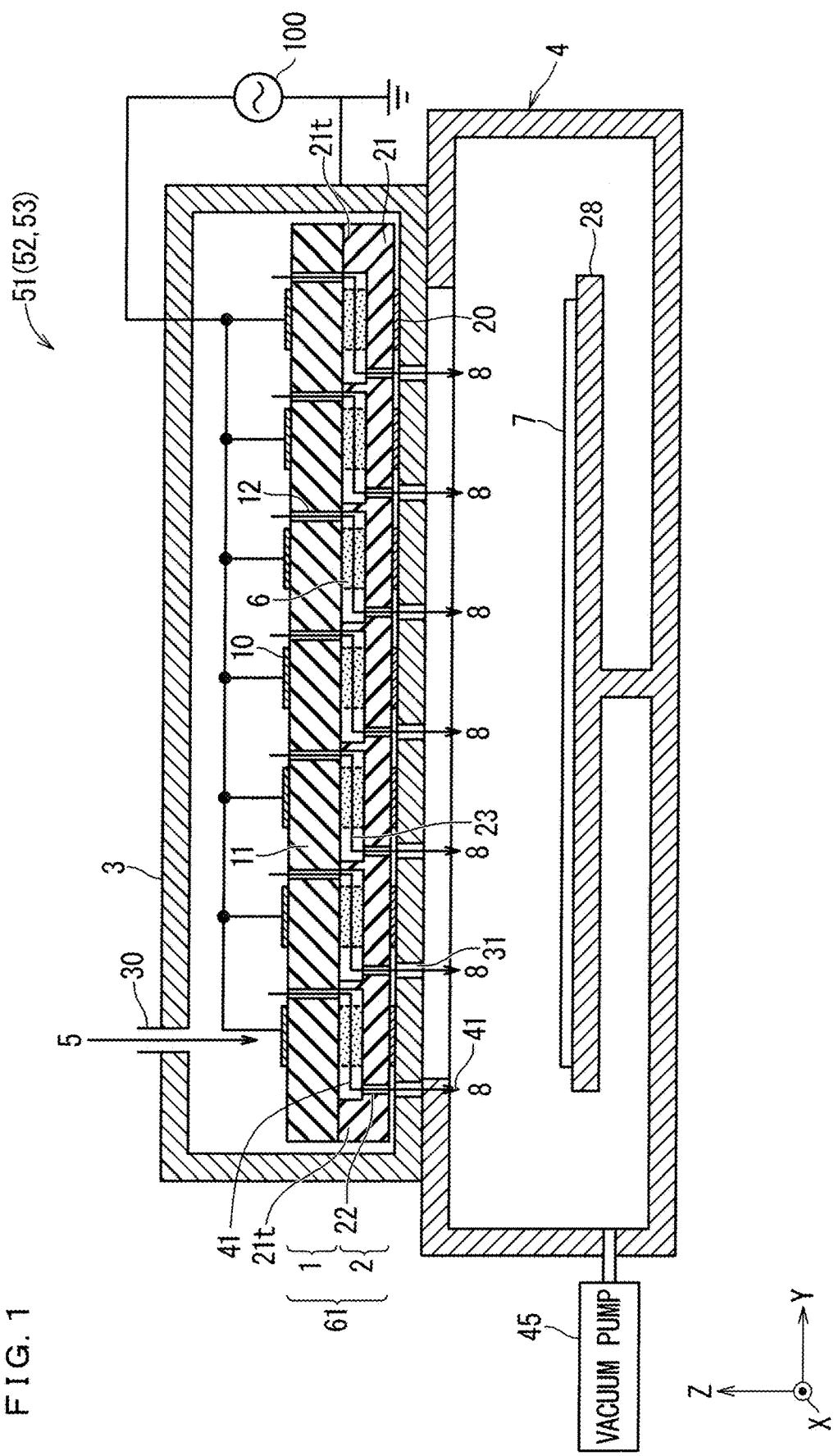
FIG. 1 An explanation diagram illustrating a whole configuration of an active gas generation apparatus according to an embodiment 1.

FIG. 1 is an explanation diagram illustrating a whole configuration of an active gas generation apparatus 51 which is an embodiment 1 of the present disclosure. An XYZ rectangular coordinate system is illustrated in FIG. 1. As illustrated in FIG. 1, the active gas generation apparatus 51 includes a dielectric barrier discharge structure 61 provided in a metal generator cover 3, a chamber 4 as a lamination room, a vacuum pump 45, and a high frequency power source 100 as main constituent elements.

The generator cover 3 includes a gas supply port 30 for supplying material gas 5 on an upper side thereof, and houses the dielectric barrier discharge structure 61 in an inner side thereof.

The dielectric barrier discharge structure 61 includes a high voltage apply electrode part 1 as a first electrode constituting part and a ground potential electrode part 2 as a second electrode constituting part provided on a lower side of the high voltage apply electrode part 1 as main constituent elements. Active gas 8 obtained by activating material gas 5 supplied to each of a plurality of discharge spaces 6 is generated in the dielectric barrier discharge structure 61.

Figure 2:
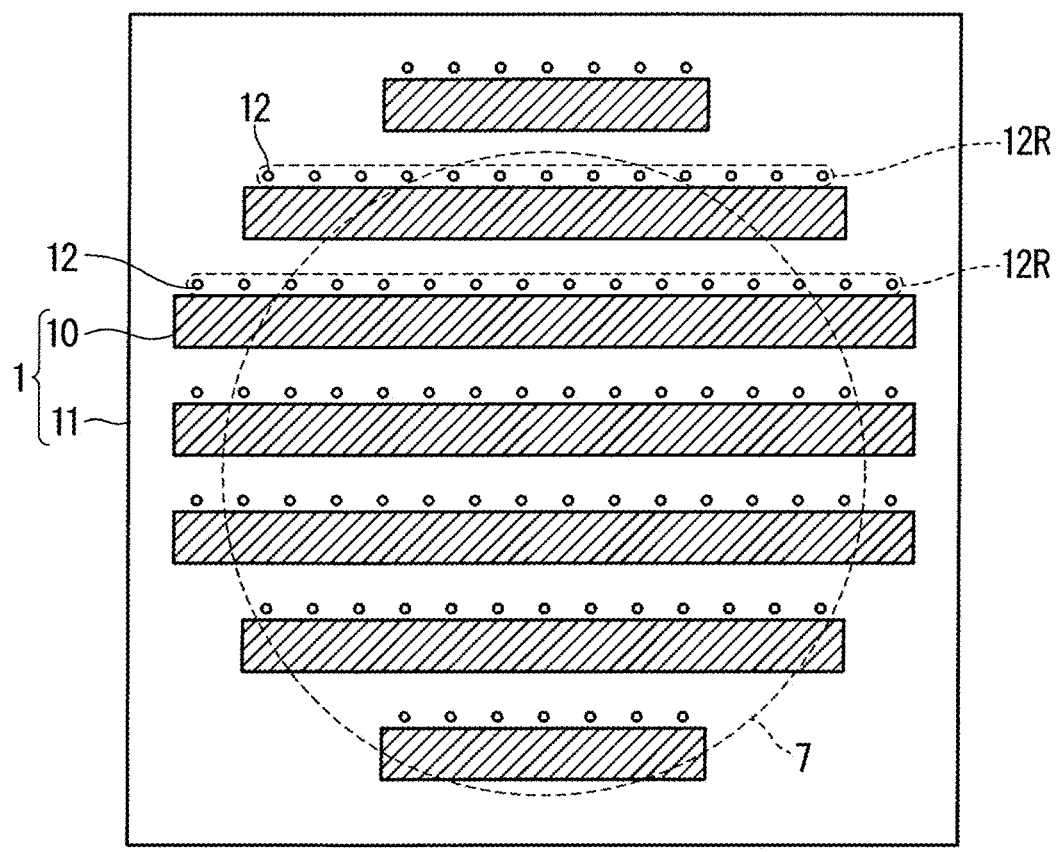
FIG. 2 A plan view (No. 1) illustrating a planar structure of a high voltage apply electrode part illustrated in FIG. 1.
Figure 3:
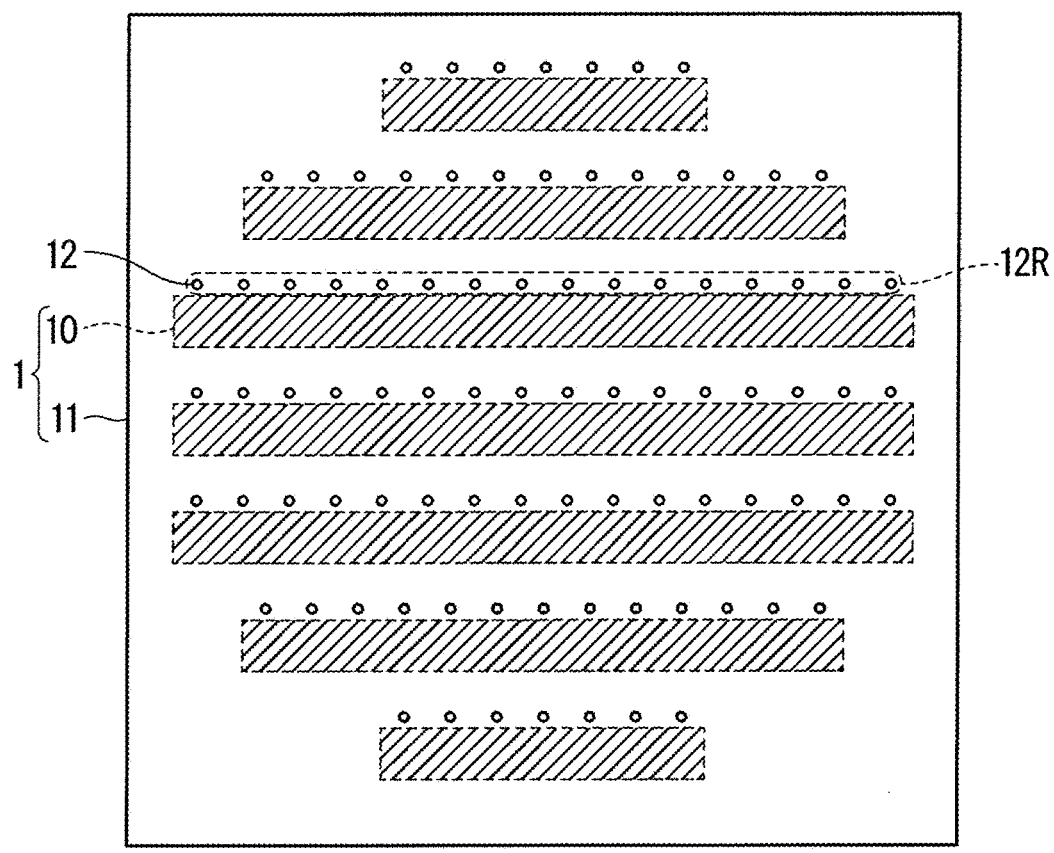
FIG. 3 A plan view (No. 2) illustrating a planar structure of the high voltage apply electrode part.
Figure 4:
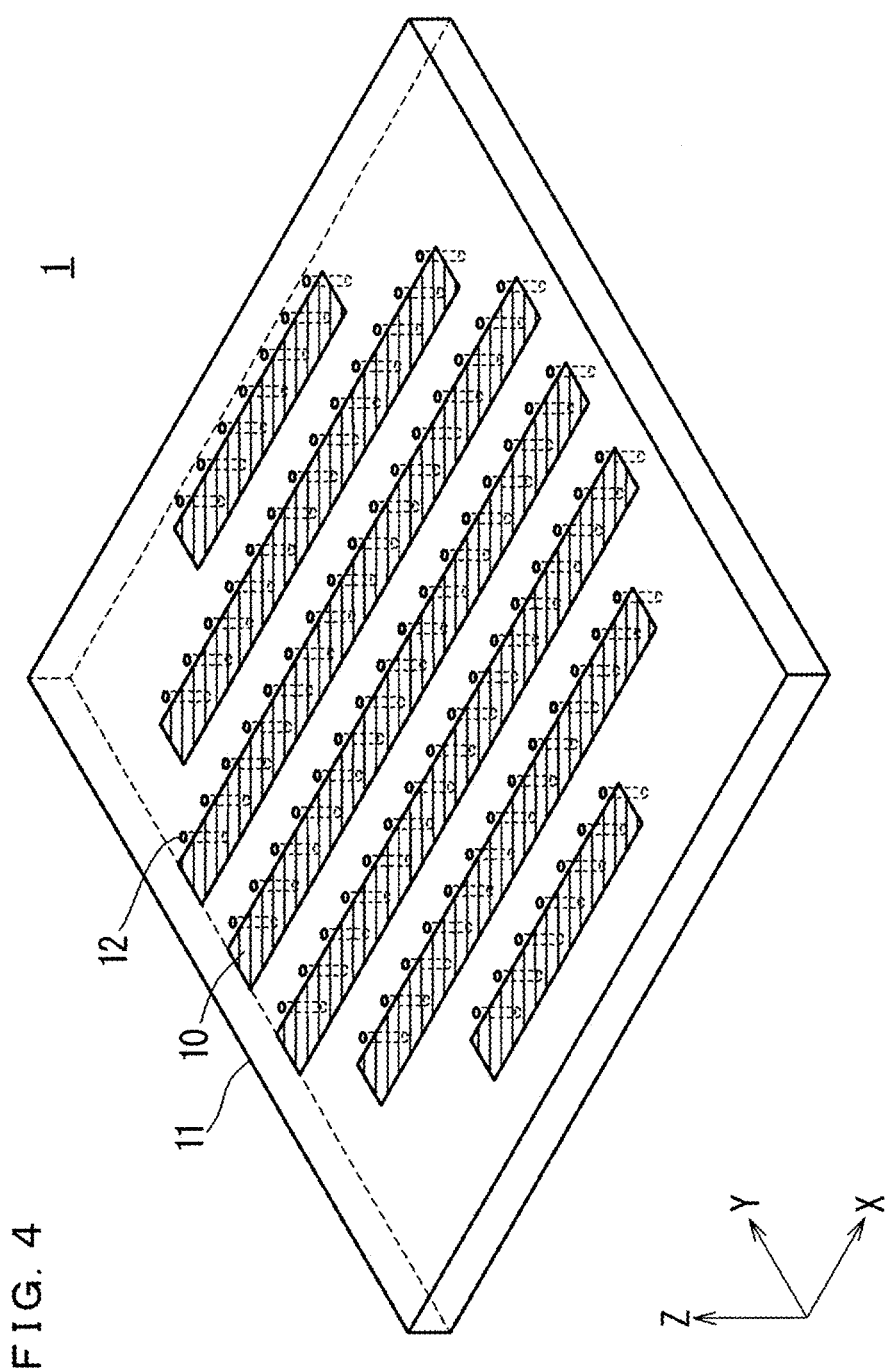
FIG. 4 A perspective view illustrating a whole configuration of the high voltage apply electrode part.

FIG. 2 and FIG. 3 are plan views each illustrating a planar structure of the high voltage apply electrode part 1. FIG. 2 is a plan view viewed from an upper side, and FIG. 3 is a plan view viewed from a lower side. FIG. 4 is a perspective view illustrating a whole configuration of the high voltage apply electrode part 1. An XYZ rectangular coordinate system is illustrated in FIG. 2 to FIG. 4.

Figure 5:
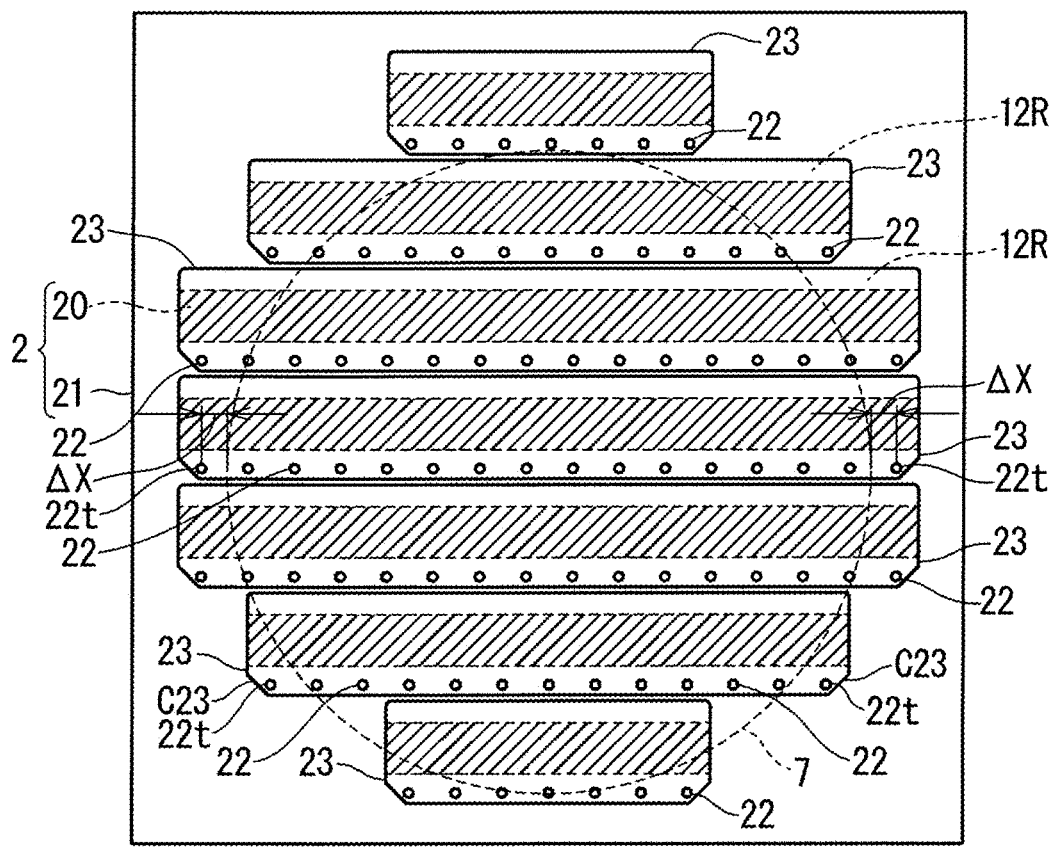
FIG. 5 A plan view (No. 1) illustrating a planar structure of a ground potential electrode part illustrated in FIG. 1.
Figure 6:
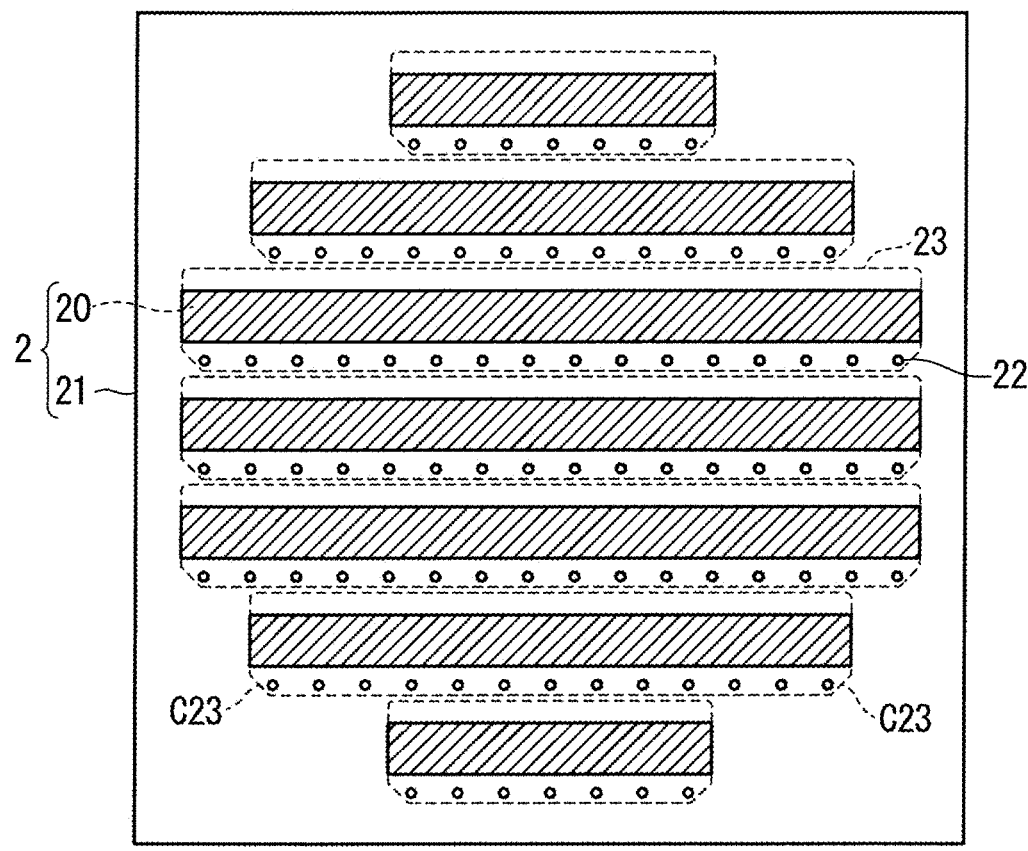
FIG. 6 A plan view (No. 2) illustrating a planar structure of the ground potential electrode part.
Figure 6:
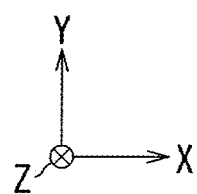
Figure 7:
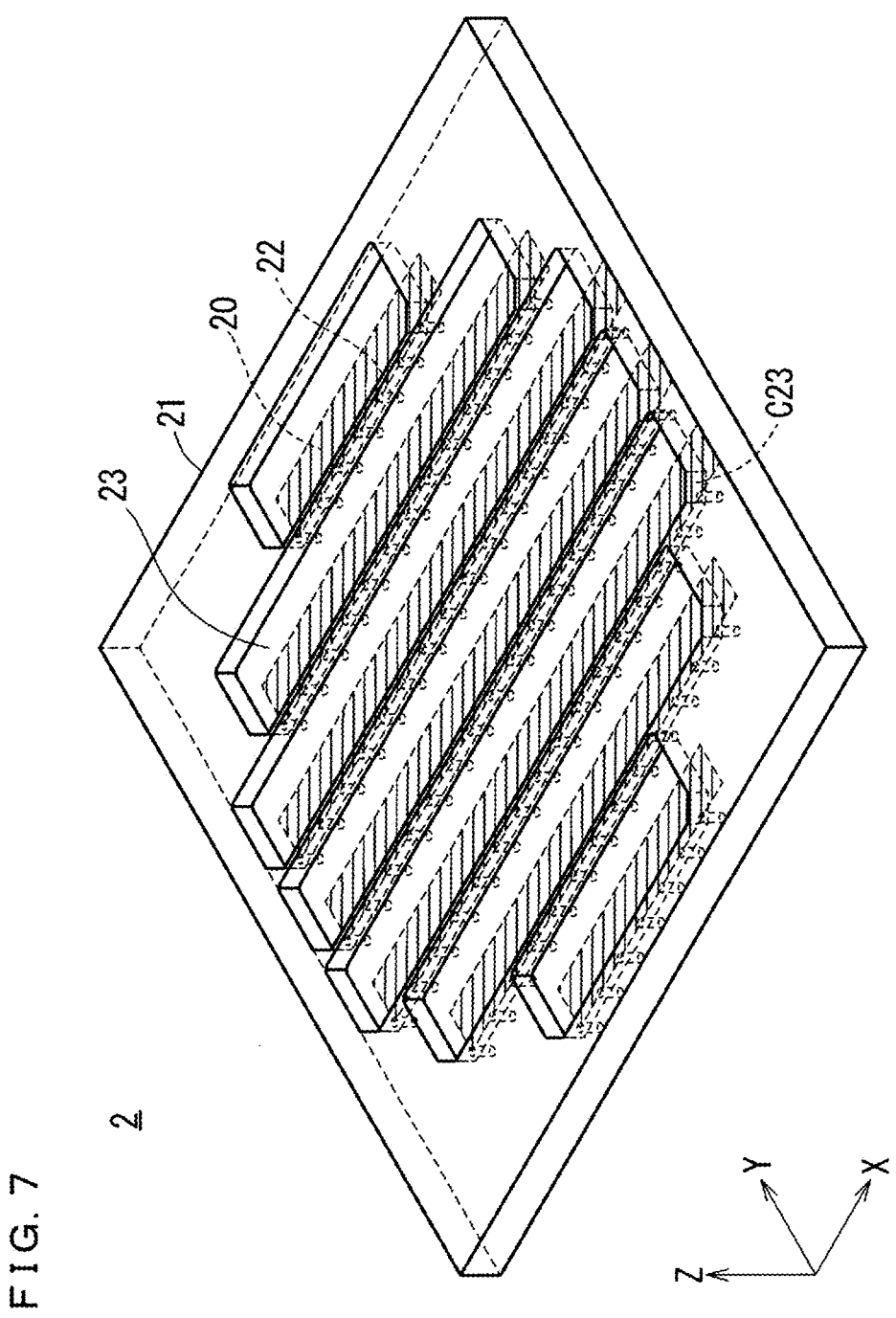
FIG. 7 A perspective view illustrating a whole configuration of the ground potential electrode part.

FIG. 5 and FIG. 6 are plan views each illustrating a planar structure of the ground potential electrode part 2. FIG. 5 is a plan view viewed from an upper side, and FIG. 6 is a plan view viewed from a lower side. FIG. 7 is a perspective view illustrating a whole configuration of the ground potential electrode part 2. An XYZ rectangular coordinate system is illustrated in FIG. 5 to FIG. 7.

Figure 8:
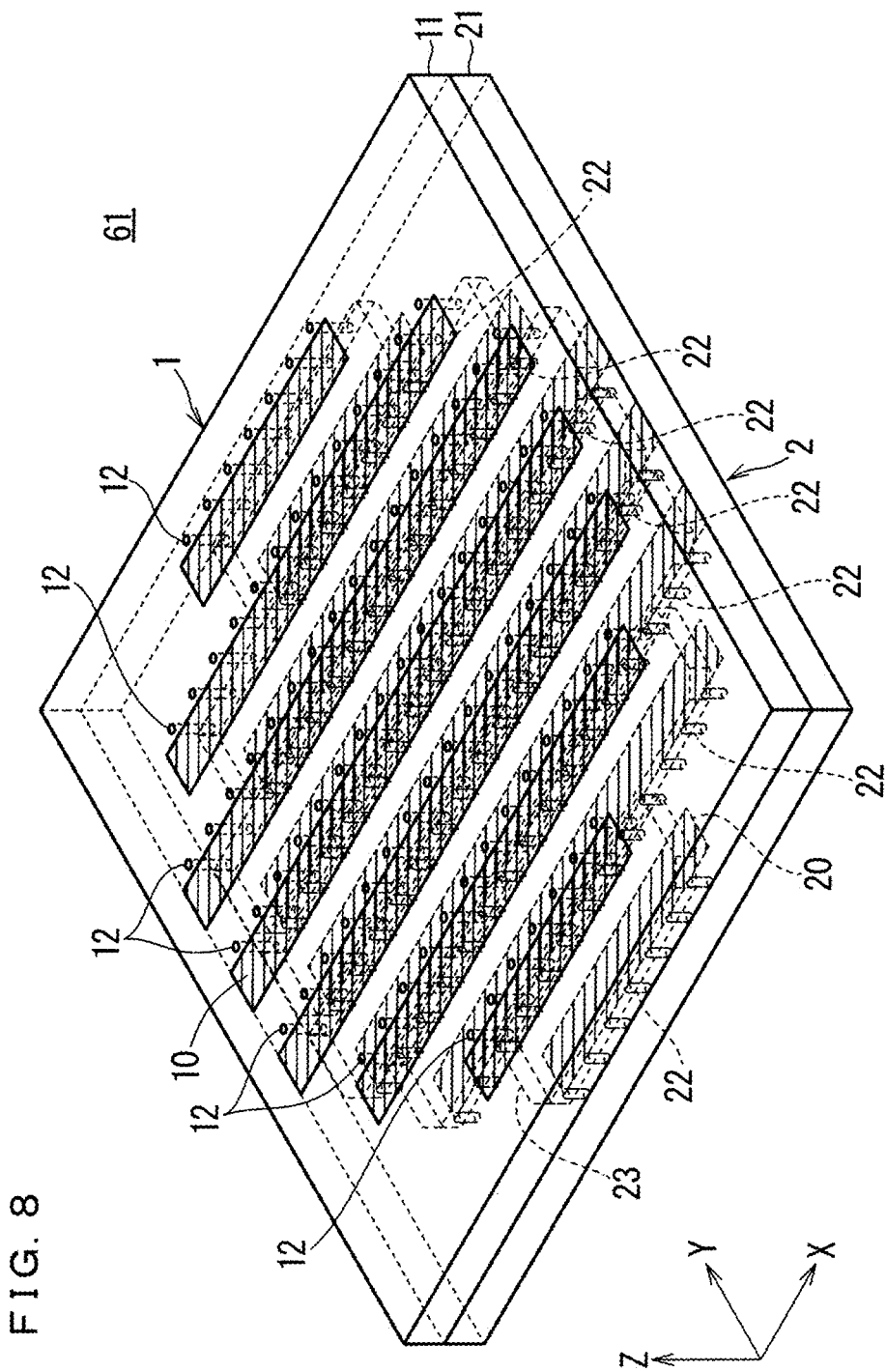
FIG. 8 A perspective view illustrating a whole structure of a dielectric barrier discharge structure.

FIG. 8 is a perspective view illustrating a whole structure of a dielectric barrier discharge structure 61. An XYZ rectangular coordinate system is illustrated in FIG. 8.

As illustrated in FIG. 1 to FIG. 4 and FIG. 8, the high voltage apply electrode part 1 includes an electrode dielectric film 11 as a first electrode dielectric film and a plurality of metal electrodes 10 as a plurality of first metal electrodes formed on an upper surface of the electrode dielectric film 11.

As illustrated in FIG. 1 and FIG. 5 to FIG. 8, the ground potential electrode part 2 includes an electrode dielectric film 21 as a second electrode dielectric film and a plurality of metal electrodes 20 as a plurality of second metal electrodes formed on a lower surface of the electrode dielectric film 21.

As illustrated in FIG. 1, alternating voltage is applied to the plurality of metal electrodes 10 from the high frequency power source 100, and the plurality of metal electrodes 20 are set to have ground potential as reference potential via a bottom surface of the metal generator cover 3.

As illustrated in FIG. 1, a peripheral region of the electrode dielectric film 21 includes a protruding part 21t protruding to an upper side (+Z direction) to provide the plurality of discharge spaces 6 between the high voltage apply electrode part 1 and the ground potential electrode part 2. A gap length of each of the plurality of discharge spaces 6 is regulated by a protrusion length of the protrusion part 21t.

As illustrated in FIG. 2, the electrode dielectric film 11 as the first electrode dielectric film has a rectangular shape (substantially a square shape) in a plan view, and includes a plurality of gas supply regions 12R separately disposed along a Y direction as a first direction. Each of the plurality of gas supply regions 12R includes a plurality of gas supply holes 12.

The plurality of gas supply holes 12 are provided separately from each other at regular intervals (first intervals) along an X direction as a second direction. As illustrated in FIG. 1, the plurality of gas supply holes 12 pass through the electrode dielectric film 11. The X direction is a direction intersecting with the Y direction at right angle.

As illustrated in FIG. 2 to FIG. 4 and FIG. 8, the plurality of metal electrodes 10 are disposed separately from each other along the Y direction, and each of the plurality of metal electrodes 10 is formed to extend in the X direction. Each of the plurality of metal electrodes 10 has a rectangular shape in a plan view.

As illustrated in FIG. 2, a region where the plurality of metal electrodes 10 and the plurality of gas supply regions 12R are formed includes a wafer size (illustrated by a broken line in FIG. 2) of a wafer 7 as a processing target substrate, and has a little wide planar shape.

As illustrated in FIG. 5 to FIG. 8, the electrode dielectric film 21 as the second electrode dielectric film has a rectangular shape (substantially a square shape) in a plan view, and includes a plurality of gap regions 23 separately disposed along the Y direction. The plurality of gap regions 23 function as a plurality of discharge area formation regions each including the discharge space 6 therein.

Each of the plurality of gap regions 23 includes a concave region concaved from a surface thereof, and the concave region is provided to extend in the X direction (second direction). That is to say, the concave region of each of the plurality of gap regions 23 is continuously formed in the X direction.

Each of the plurality of gap regions 23 has substantially a rectangular shape in which a part of a corner part is chamfered in a plan view. The electrode dielectric film 21 and the electrode dielectric film 11 have the same shape in a plan view.

A plurality of gas ejection holes 22 are provided on a lower side of each of the plurality of gap regions 23. The plurality of gas ejection holes 22 are provided separately from each other at regular intervals (second intervals) along the X direction. As illustrated in FIG. 1, the plurality of gas ejection holes 22 pass through the electrode dielectric film 21 below the plurality of gap regions 23.

As illustrated in FIG. 6, the plurality of gas ejection holes 22 are disposed with a constant distance (for example, approximately 10 mm) from the metal electrode 20 along the Y direction. The constant distance is changed in accordance with a size of the apply voltage. For example, when apply voltage of 6 kV0p is applied to the plurality of metal electrodes 10 from the high frequency power source 100, and downstream side pressure in the chamber 4 in a downstream of the gas ejection hole 22 is 200 to 500 Pa, it is confirmed that the constant distance described above needs to have a length of approximately 10 mm.

The reason is that electrical field strength immediately below the plurality of gas ejection holes 22 is reduced and occurrence of abnormal electrical discharge at that position is prevented. The pressure in the plurality of discharge spaces 6 needs to be relatively high (equal to or larger than 10 kPa) in the dielectric barrier discharge used in the embodiment 1, thus the plurality of gas ejection holes 22 also function as orifices. A difference in pressure can be provided between the plurality of discharge spaces 6 and the chamber 4 by the plurality of gas ejection holes 22 functioning as the orifices.

Accordingly, there is a risk of occurrence of the abnormal electrical discharge when electrical field strength increases just a little at outlets of the gas ejection holes 22 functioning as the orifices. When the abnormal electrical discharge occurs, there is a possibility that components of the electrode dielectric film 21 and the metal electrode 20 are evaporated and fall to the wafer 7 disposed in the chamber 4 in the downstream, thereby causing metal contamination.

The plurality of gas ejection holes 22 are disposed with the constant distance from the metal electrode 20 to prevent such a possibility.

As illustrated in FIG. 5 to FIG. 8, the plurality of metal electrodes 20 are disposed along the Y direction, and each of the plurality of metal electrodes 20 is formed to extend in the X direction. Each of the plurality of metal electrodes 20 has a rectangular shape in a plan view.

The plurality of metal electrodes 10 (the plurality of first metal electrodes), the plurality of gas supply regions 12R, the plurality of metal electrodes 20 (the plurality of second metal electrodes), the plurality of gap regions 23 (the plurality of discharge area formation regions), and the plurality of discharge spaces 6 correspond to each other on a one-to-one basis.

As illustrated in FIG. 5, a region where the plurality of metal electrodes 20 and the plurality of gap regions 23 are Rained includes a wafer size (illustrated by a broken line in FIG. 5) of the wafer 7 as the processing target substrate, and has a little large area.

The dielectric barrier discharge structure 61 illustrated in FIG. 1 and FIG. 8 is made by locating the high voltage apply electrode part 1 on the ground potential electrode part 2 so that the electrode dielectric film 21 and the electrode dielectric film 11 coincide with each other in a plan view.

In the dielectric barrier discharge structure 61 according to the embodiment 1, seven metal electrodes 10, seven gap regions 23, seven metal electrodes 20, seven gas supply regions 12R, and seven discharge spaces 6 correspond to each other on a one-to-one basis.

That is to say, the gas supply region 12R and the metal electrode 10 located in an $i^{th}$ order (i=any of 1 to 7) in the Y direction with reference to FIG. 1 to FIG. 4 and FIG. 8 and the gap region 23 and the metal electrode 20 located in the $i^{th}$ order in the Y direction with reference to FIG. 1 and FIG. 5 to FIG. 8 correspond to each other. Herein, "the $i^{th}$ order in the Y direction" indicates an order of formation from a highest position in the Y direction.

A region where the metal electrode 10 and the metal electrode 20 are overlapped with each other in a plan view in the gap region 23 located in the $i^{th}$ order in the Y direction serves as the discharge space 6 located in the $i^{th}$ order in the Y direction.

In this manner, in the dielectric barrier discharge structure 61 according to the embodiment 1, the gas supply region 12R, the metal region 10, the gap region 23, the metal electrode 20, and the discharge space 6 located in the $i^{th}$ order in the Y direction correspond to each other on a one-to-one basis.

Herein, the metal electrode 10, the metal electrode 20, the gas supply region 12R, the gap region 23, and the discharge space 6 corresponding to each other in the plurality of metal electrodes 10, the plurality of metal electrodes 20, the plurality of gas supply regions 12R, the plurality of gap regions 23, and the plurality of discharge spaces 6 are defined as a corresponding metal electrode 10p, a corresponding metal electrode 20p, a corresponding gas supply region 12Rp, a corresponding gap region 23p, and a corresponding discharge space 6p, respectively.

The corresponding metal electrode 10p serves as a first corresponding metal electrode, the corresponding metal electrode 20p serves as a second corresponding metal electrode, and the corresponding gap region 23p serves as a corresponding discharge area formation region.

Figure 9:
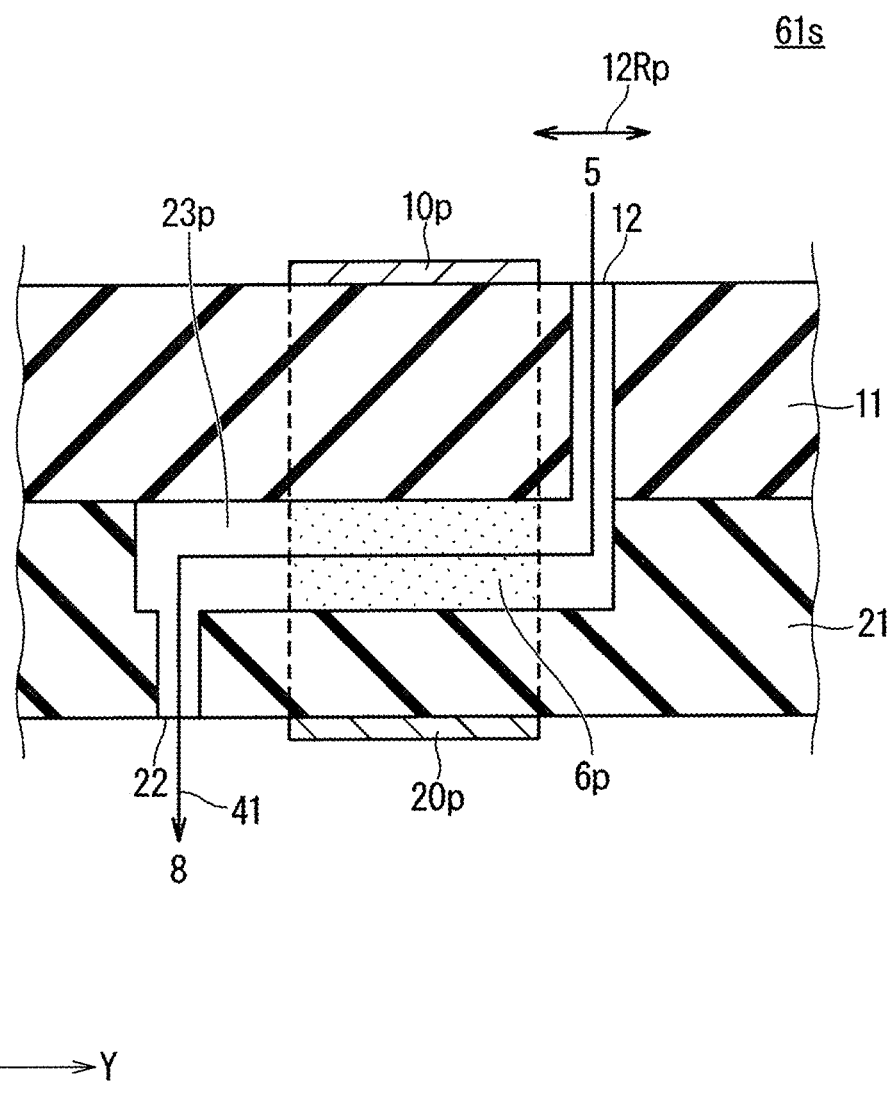
FIG. 9 A cross-sectional view illustrating a cross-sectional structure of one direction discharge structure according to the embodiment 1.

FIG. 9 is a cross-sectional view illustrating a cross-sectional structure of one direction discharge structure 61s in the dielectric barrier discharge structure 61. Herein, "one direction discharge structure 61s" indicates a structure of one discharge space 6 and a structure around the discharge space 6 classified by a formation position in the Y direction in seven discharge spaces 6 each provided to extend in the X direction.

Figure 10:
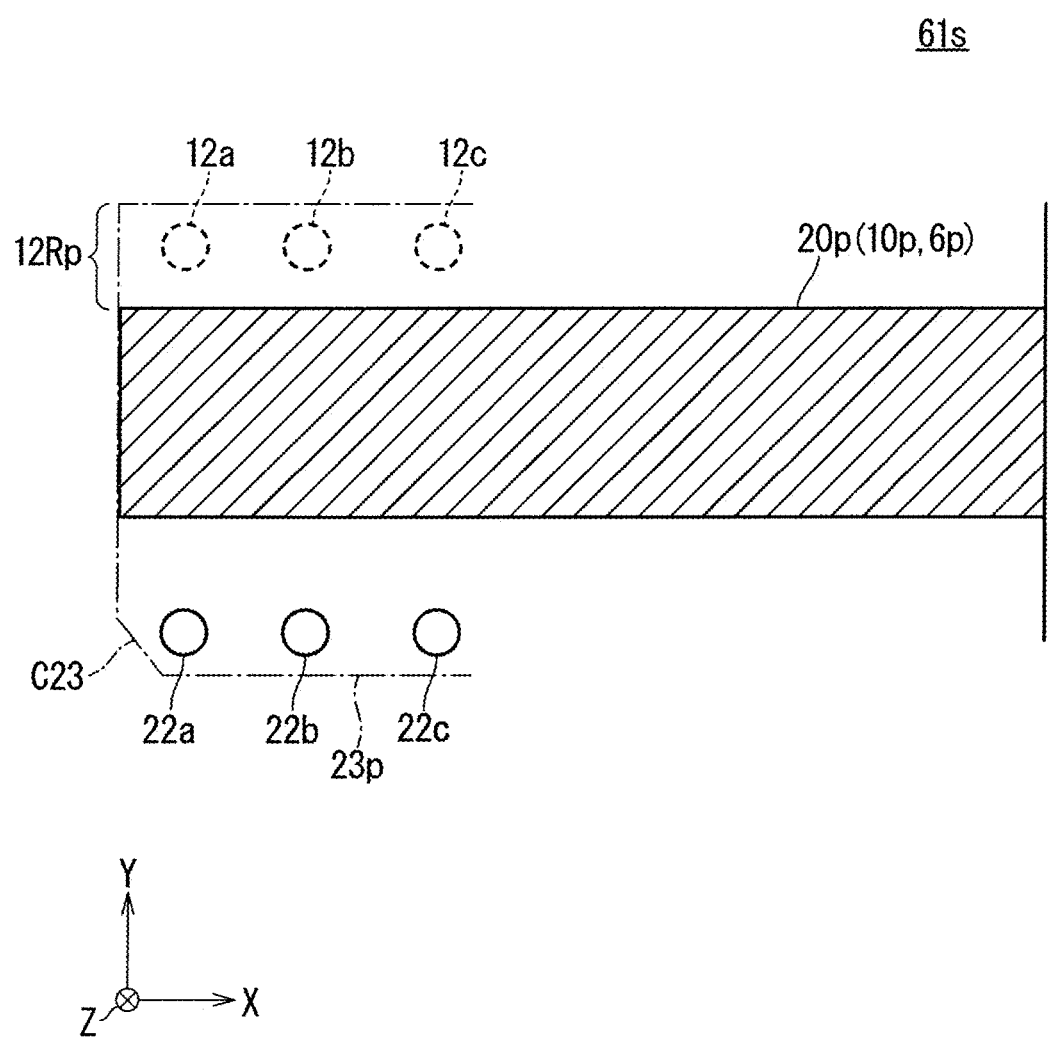
FIG. 10 An explanation diagram schematically illustrating a planar structure of one direction discharge structure viewed from a lower side.

FIG. 10 is an explanation diagram schematically illustrating a planar structure of one direction discharge structure 61s viewed from a lower side (a side of a −Z direction). An XYZ rectangular coordinate system is illustrated in each of FIG. 9 and FIG. 10.

As illustrated in FIG. 9, in one direction discharge structure 61s in the active gas generation apparatus 51 according to the embodiment 1, a region where the corresponding metal electrode 10p and the corresponding metal electrode 20p are overlapped with each other in a plan view serves as the corresponding discharge space 6p in the corresponding gap region 23p.

Accordingly, when the high voltage is applied to the plurality of metal electrodes 10 from the high frequency power source 100, dielectric barrier discharge in which gas breakdown occurs can be generated in the corresponding discharge space 6p.

As a result, the material gas 5 supplied from the gas supply hole 12 of the corresponding gas supply region 12Rp is activated in the corresponding discharge space 6p in which the dielectric barrier discharge occurs to be the active gas 8, and the active gas 8 is ejected toward the chamber 4 not shown on a lower side from the gas ejection hole 22 below the corresponding gap region 23p along a gas flow 41.

As illustrated in FIG. 9 and FIG. 10, one direction discharge structure 61s satisfies the following arrangement conditions (a) to (c).

(a) The region where the corresponding metal electrode 10p and the corresponding metal electrode 20p are overlapped with each other in a plan view serves as the corresponding discharge space 6p in the corresponding gap region 23p.

(b) The corresponding gap region 23p and the plurality of gas supply holes 12 provided in the corresponding gas supply region 12Rp are overlapped with each other in a plan view.

(c) The plurality of gas supply holes 12 provided in the corresponding gas supply region 12Rp and the plurality of gas ejection holes 22 provided below the corresponding gap region 23p sandwich the corresponding discharge space 6p in a plan view, and are disposed to face each other on a one-to-one basis along the Y direction (first direction).

The arrangement condition (c) described above is described hereinafter. As illustrated in FIG. 10, a gas supply hole 12a and a gas ejection hole 22a sandwich the corresponding discharge space 6p to face each other along the Y direction, a gas supply hole 12b and the gas ejection hole 22b sandwich the corresponding discharge space 6p to face each other along the Y direction, and a gas supply hole 12c and the gas ejection hole 22c sandwich the corresponding discharge space 6p to face each other along the Y direction. In this manner, one direction discharge structure 61s satisfies the arrangement condition (c).

A position in the X direction (coordinate) of the gas supply hole 12a is the same as that of the gas ejection hole 22a, a position in the X direction of the gas supply hole 12b is the same as that of the gas ejection hole 22b, and position in the X direction of the gas supply hole 12c is the same as that of the gas ejection hole 22c. Accordingly, the first interval between the adjacent gas supply holes 12 and 12 is also the same as the second interval between the adjacent gas ejection holes 22 and 22. When a highest priority is put on reliable prevention of interference by the active gas 8 between the adjacent gas ejection holes 22 and 22, a corresponding inter-hole distance from the gas supply hole 12 to the gas ejection hole 22 corresponding to each other along the Y direction is preferably set to be equal to or smaller than the first and second interval.

Returning to FIG. 1, the active gas generation apparatus 51 includes the chamber 4 disposed on a lower side of the electrode dielectric film 21. A mounting part 28 is provided on the bottom surface of the chamber 4, and the wafer 7 as the processing target substrate is disposed on the mounting part 28. An exhaust outlet of the chamber 4 is connected to the vacuum pump 45. A mounting surface of the mounting part 28 has a planar shape substantially the same as the wafer 7.

In the active gas generation apparatus 51 according to the embodiment 1, as illustrate in FIG. 5, the plurality of gas ejection holes 22 provided in each of the plurality of gap regions 23 include a pair of end portion gas ejection holes 22t located on both ends thereof in the X direction. The pair of end portion gas ejection holes 22t are not overlapped with the wafer 7 as the processing target substrate in a plan view, but are disposed on an outer side of a surface of the wafer 7 in each of the plurality of gap regions 23.

For example, the end portion gas ejection holes 22t and 22t formed in the fourth order (i=4) in the Y direction are not overlapped with the wafer 7, but are disposed on the outer side of the surface of the wafer 7 by a distance ΔX. The distance ΔX is set to approximately 10 mm, for example.

Furthermore, as illustrated in FIG. 5 to FIG. 7, corner parts located near the pair of end portion gas ejection holes 22t in the plurality of gas ejection holes 22 are chamfered to constitute a pair of chamfered corner parts C23 in the plurality of gap regions 23.

The gap region 23 has substantially a rectangular shape in a plan view, thus when the pair of chamfered corner parts C23 is not provided, the active gas 8 tends to remain in the corner part. Thus, the pair of chamfered corner parts C23 are provided in the corner parts closest to the pair of end portion gas ejection holes 22t in the gap region 23. In this manner, the gap region 23 includes the pair of chamfered corner parts C23 as a refining structure of leading the active gas 8 to the pair of end portion gas ejection holes 22t.

(Effect)

One direction discharge structure 61s in the active gas generation apparatus 51 according to the embodiment 1 satisfies the arrangement conditions (a) to (c) described above. Thus, the active gas having an equal radical concentration can be ejected from each of the plurality of gas ejection holes 22, in each of the plurality of gap regions 23 in accordance with first and second causes described hereinafter.

The first cause indicates that the material gas 5 supplied from the plurality of gas supply holes 12 uniformly goes through the discharge space 6 in each gas supply region 12R, thus the radical concentration of the active gas 8 (radical gas) ejected from the plurality of gas ejection holes 22 is equalized.

The second cause indicates that the flow of the material gas 5 supplied from the gas supply hole 12 is regulated by the gap region 23 including the concave region. That is to say, the flow of the material gas 5 is regulated by the gap region 23 to flow straight along the Y direction to be directed to the corresponding gas ejection hole 22. As a result, the second cause indicates that the staying time in each of the plurality of discharge spaces 6 is equalized regardless of which gas supply hole 12 the material gas 5 is supplied from.

Furthermore, the plurality of gas ejection holes 22 provided on a lower side of each of the plurality of gap regions 23 are disposed at regular intervals along the X direction as the second direction, thus the active gas 8 can be uniformly ejected from each of the plurality of gas ejection holes 22.

As a result, the active gas generation apparatus 51 according to the embodiment 1 can uniformly eject the active gas having the equal radical concentration from each of all the gas ejection holes 22 (all gas ejection holes 22 illustrated in FIG. 5 and FIG. 6) provided in the plurality of gap regions 23 (all of the first to seventh gap regions 23 in the Y direction illustrated in FIG. 5 and FIG. 6).

The active gas generation apparatus 51 according to the embodiment 1 has a gas ejection hole arrangement structure that the pair of end portion gas ejection holes 22t are not overlapped with the wafer 7 as the processing target substrate in a plan view, but are disposed on the outer side of the surface of the wafer 7 in each of the plurality of gap regions 23.

The active gas generation apparatus 51 according to the embodiment 1 has the gas ejection hole arrangement structure described above, thus can uniformly eject the active gas having the equal radical concentration to a whole region of the surface of the wafer 7 as the processing target substrate.

The active gas generation apparatus 51 according to the embodiment 1 includes the pair of chamfered corner parts C23 as the refining structure in the plurality of gap regions 23.

Thus, the active gas generation apparatus 51 according to the embodiment 1 can smoothen the gas flow 41 of the active gas 8 to prevent the gas flow 41 of the active gas 8 from being stirred between the gas ejection holes 22 and 22 adjacent to each other in the plurality of gas ejection holes 22 provided in each of the plurality of gap regions 23. The gas flow 41 is easily stirred particularly in the pair of end portion gas ejection holes 22t and a surrounding area thereof.

As a result, the active gas generation apparatus 51 according to the embodiment 1 can prevent inactivation of the active gas 8, and can uniformize a gas flow amount of the active gas 8 between the plurality of gas ejection holes 22 and 22.

Embodiment 2

Figure 11:
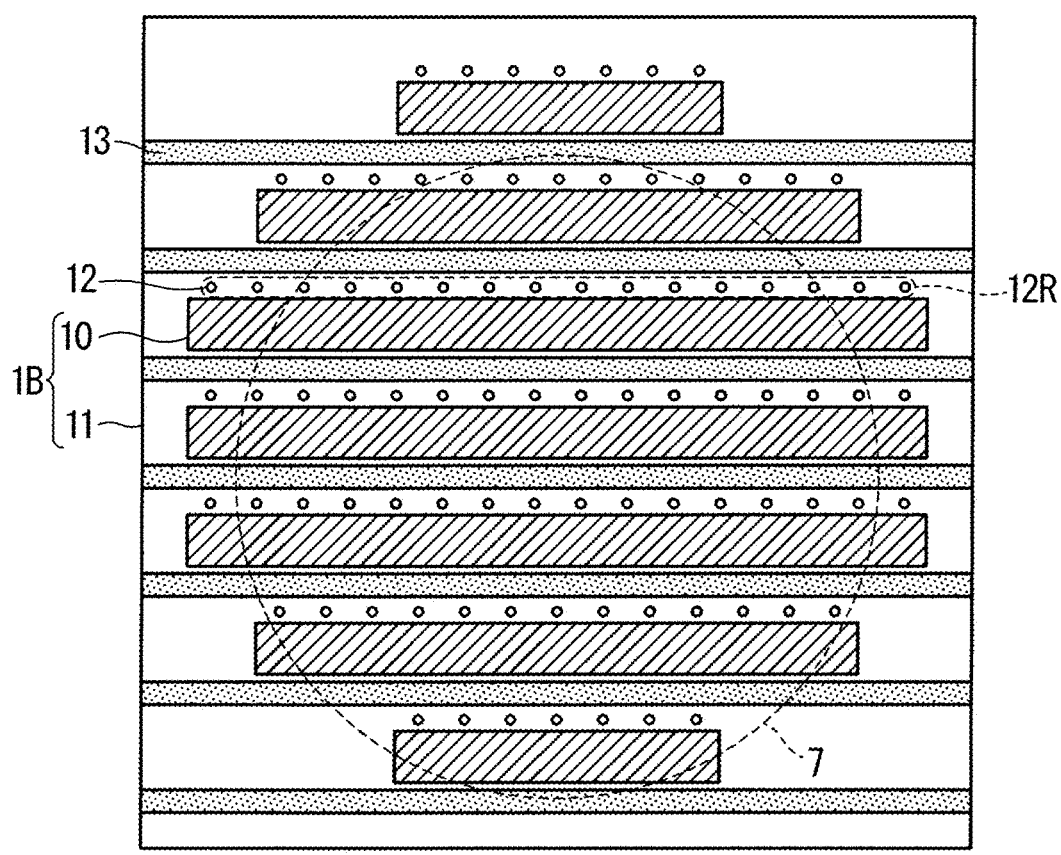
FIG. 11 A plan view illustrating a planar structure of a high voltage apply electrode part in an active gas generation apparatus as an embodiment 2.
Figure 12:
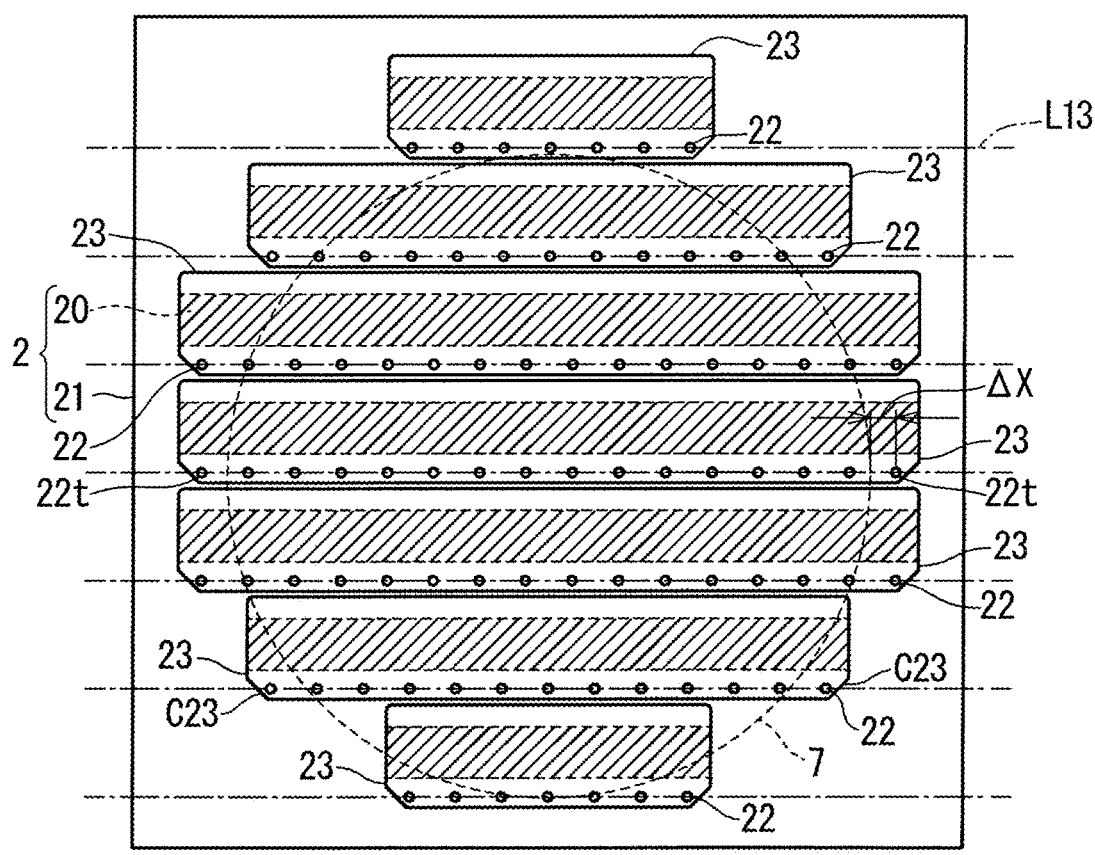
FIG. 12 A plan view illustrating a planar structure of a ground potential electrode part according to the embodiment 2.

FIG. 11 is a plan view illustrating a planar structure of a high voltage apply electrode part 1B in an active gas generation apparatus 52 as an embodiment 2. FIG. 12 is a plan view illustrating a planar structure of the ground potential electrode part 2 in the active gas generation apparatus 52. FIG. 11 and FIG. 12 are plan views each viewed from an upper side. An XYZ rectangular coordinate system is illustrated in each of FIG. 11 and FIG. 12.

A whole configuration of the active gas generation apparatus 52 is similar to the structure according to the embodiment 1 illustrated in FIG. 1 and FIG. 8 except that the high voltage apply electrode part 1 is replaced with the high voltage apply electrode part 1B. The same sign as that in the embodiment 1 is assigned to a constituting part similar to that according to the embodiment 1 hereinafter. The description thereof is appropriately omitted, and a characteristic part of the embodiment 2 is mainly described.

As illustrated in FIG. 11, the high voltage apply electrode part 1B has characteristics that it further includes a plurality of high voltage side ground metal electrodes 13 as a plurality of auxiliary conductive films formed on an upper surface of the electrode dielectric film 11 as the first electrode dielectric film. Each of the plurality of high voltage side ground metal electrodes 13 has a rectangular shape in a plan view. The plurality of high voltage side ground metal electrodes 13 are provided electrically independently from the plurality of metal electrodes 10.

A plurality of high voltage side ground center line L13 illustrated in FIG. 12 serve as lines indicating a center position of the plurality of high voltage side ground metal electrodes 13 in the Y direction in a plan view. As illustrated in FIG. 12, the plurality of high voltage side ground center lines L13 serve as lines extending to be overlapped with the plurality of gas ejection holes 22 formed on a lower side of each of the plurality of gap regions 23.

The plurality of high voltage side ground metal electrodes 13 are set to have ground potential as reference potential (not shown). For example, the plurality of high voltage side ground metal electrodes 13 are set to have the ground potential via the metal generator cover 3 set to have the ground potential and a connection wire.

The plurality of high voltage side ground metal electrodes 13 correspond to the plurality of gap regions 23 on a one-to-one basis. Accordingly, in the active gas generation apparatus 52 according to the embodiment 2, the plurality of metal electrodes 10, the plurality of gas supply regions 12R, the plurality of metal electrodes 20, the plurality of gap regions 23, the plurality of discharge spaces 6, and the plurality of high voltage side ground metal electrodes 13 (the plurality of high voltage side ground center lines L13) correspond to each other on a one-to-one basis.

Herein, in the plurality of high voltage side ground metal electrodes 13 and the plurality of high voltage side ground center lines L13, the high voltage side ground metal electrode 13 and the high voltage side ground center line L13 corresponding to the corresponding metal electrode 10*p*, the corresponding gas supply region 12R*p*, the corresponding metal electrode 20*p*, the corresponding gap region 23*p*, and the corresponding discharge space 6*p* are defined as a corresponding high voltage side ground metal electrode 13*p* and a corresponding high voltage side ground center line L13*p*.

Figure 13:
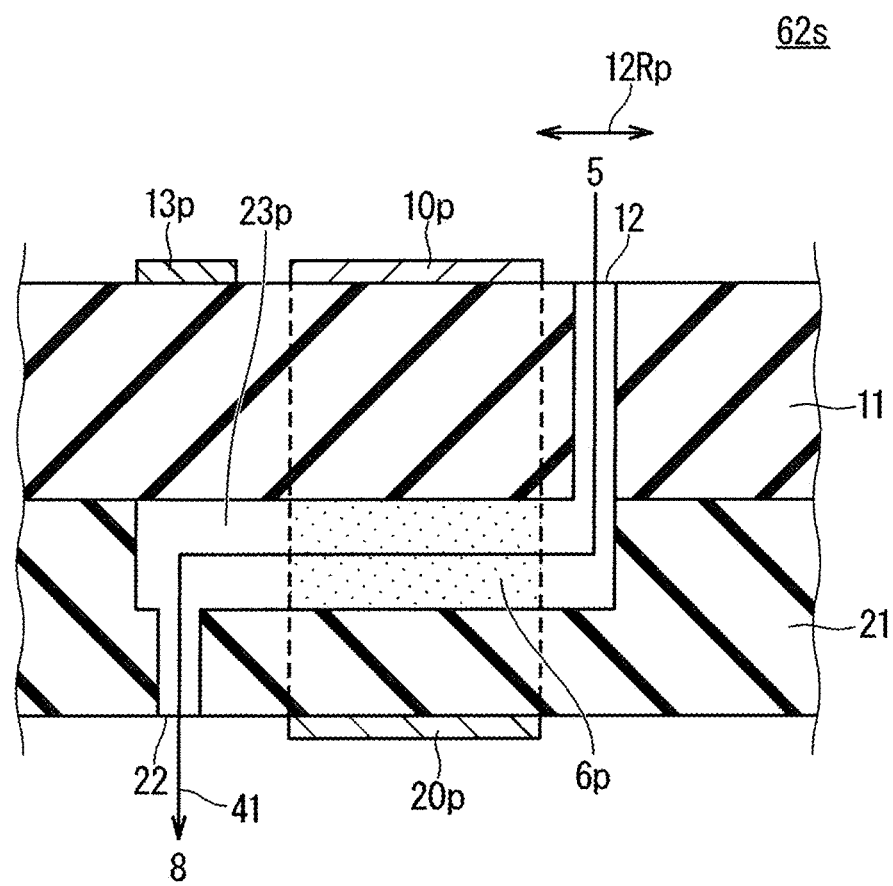
FIG. 13 A cross-sectional view illustrating a cross-sectional structure of one direction discharge structure according to the embodiment 2.

FIG. 13 is a cross-sectional view illustrating a cross-sectional structure of one direction discharge structure 62*s* in the dielectric barrier discharge structure 61. Herein, "one direction discharge structure 62*s*" indicates a structure of one discharge space 6 and a structure around the discharge space 6 classified by a formation position in the Y direction in seven discharge spaces 6 each provided to extend in the X direction. An XYZ rectangular coordinate system is illustrated in FIG. 13.

As illustrated in FIG. 13, one direction discharge structure 62*s* in the active gas generation apparatus 52 according to the embodiment 2 is similar to one direction discharge structure 61*s* illustrated in FIG. 9. However, they are different from each other in that the corresponding high voltage side ground metal electrode 13*p* is further provided.

Each of the plurality of high voltage side ground metal electrodes 13 as the plurality of auxiliary conductive films is overlapped with the plurality of gas ejection holes 22 provided in the corresponding gap region 23 in the plurality of gap regions 23.

That is to say, as illustrated in FIG. 12 and FIG. 13, the corresponding high voltage side ground metal electrode 13*p* (corresponding high voltage side ground center line L13*p*) and the plurality of gas ejection holes 22 provided on a lower side of the corresponding gap region 23*p* are provided to be overlapped with each other in a plan view.

As illustrated in FIG. 13, a formation width (length in the Y direction) of each of the plurality of high voltage side ground metal electrodes 13 is set to be sufficiently larger than the gas ejection hole 22, thus the corresponding high voltage side ground metal electrode 13*p* includes all of the plurality of gas ejection holes 22 and is overlapped therewith in a plan view.

Accordingly, the plurality of gas ejection holes 22 provided on the lower side of the corresponding gap region 23*p* are located immediately below the corresponding high voltage side ground metal electrode 13*p*. That is to say, the corresponding high voltage side ground metal electrode 13*p* is overlapped with a part of an active gas flowing path as the gas flow 41 of the active gas 8 in a plan view.

In order to prevent short circuit between the corresponding high voltage side ground metal electrode 13*p* and the corresponding metal electrode 10*p*, it is preferable to provide an interval of approximately 10 to 15 mm in the Y direction between the corresponding high voltage side ground metal electrode 13*p* and the corresponding metal electrode 10*p* when apply voltage applied from the high frequency power source 100 is assumed to be 6 kV0P.

(Effect)

One direction discharge structure 62*s* in the active gas generation apparatus 52 according to the embodiment 2 satisfies the arrangement conditions (a) to (c) described above in the manner similar to one direction discharge structure 61*s* according to the embodiment 1, thus can uniformly eject the active gas having the equal radical concentration from all of the gas ejection holes 22 provided on the lower side of the plurality of gap regions 23.

The active gas generation apparatus 52 according to the embodiment 2 has the gas ejection hole arrangement structure described above in the manner similar to the active gas generation apparatus 51 according to the embodiment 1, thus can uniformly eject the active gas having the equal radical concentration to a whole region of the surface of the wafer 7.

Furthermore, in the active gas generation apparatus 52 according to the embodiment 2, the plurality of gap regions 23 include the pair of chamfered corner parts C23 in the manner similar to the active gas generation apparatus 51 according to the embodiment 1.

Thus, the active gas generation apparatus 52 according to the embodiment 2 can prevent inactivation of the active gas 8 in the manner similar to the active gas generation apparatus 51 according to the embodiment 1, and can uniformize a gas flow amount of the active gas 8 between the plurality of gas ejection holes 22 and 22.

Furthermore, in the active gas generation apparatus 52 according to the embodiment 2, the plurality of high voltage side ground metal electrodes 13 as the plurality of auxiliary conductive layers have specific characteristics that they are overlapped with the plurality of gas ejection holes 22 provided on the lower side of the corresponding gap region 23 in the plurality of gap regions 23 in a plan view.

The active gas generation apparatus 52 according to the embodiment 2 has the specific characteristics described above, thus electrical field strength in the active gas flow path on an upper side of the plurality of gas ejection holes 22 can be reliably reduced by the high voltage side ground metal electrode 13 set to have ground potential.

In this manner, the electrical field strength near the outlets of all the gas ejection holes 22 provided in the plurality of gap regions 23 can be suppressed by the plurality of high voltage side ground metal electrodes 13.

As a result, the active gas generation apparatus 52 according to the embodiment 2 can further increase apply voltage applied to the plurality of metal electrodes 10, thus has the effect that the active gas 8 having a higher radical concentration can be generated by increasing discharge power in the plurality of discharge spaces 6.

Embodiment 3

Figure 14:
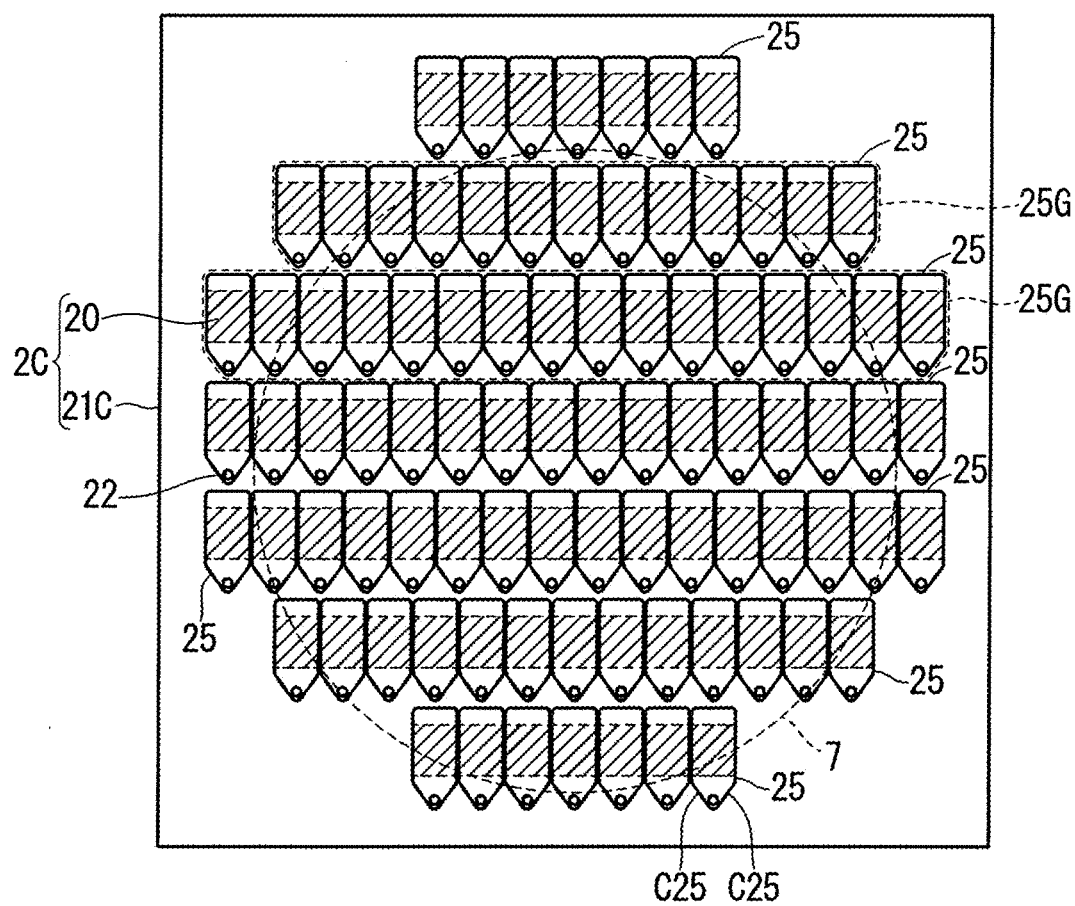
FIG. 14 A plan view (No. 1) illustrating a planar structure of the ground potential electrode part in an active gas generation apparatus as an embodiment 3.
Figure 15:
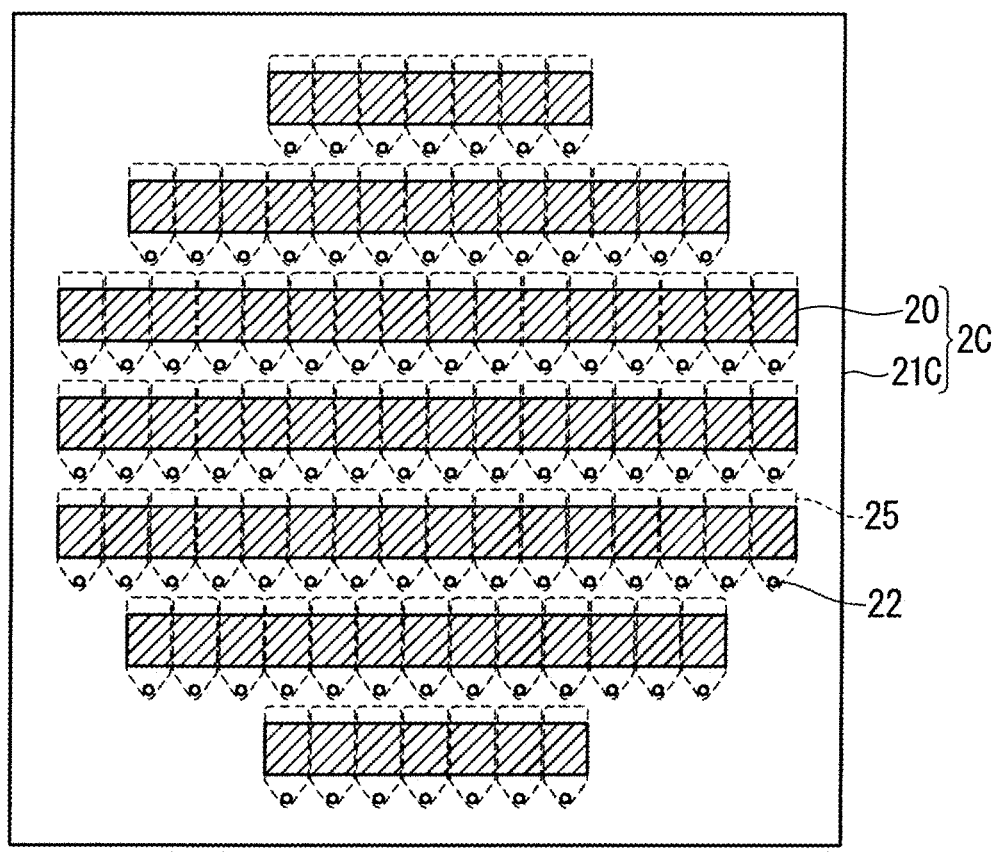
FIG. 15 A plan view (No. 2) illustrating a planar structure of the ground potential electrode part according to the embodiment 3.

FIG. 14 and FIG. 15 are plan views each illustrating a planar structure of a ground potential electrode part 2C in an active gas generation apparatus 53 as an embodiment 3 in the present disclosure. FIG. 14 is a plan view viewed from an upper side, and FIG. 15 is a plan view viewed from a lower side. An XYZ rectangular coordinate system is illustrated in each of FIG. 14 and FIG. 15.

A whole configuration of the active gas generation apparatus 53 is similar to the structure according to the embodiment 1 illustrated in FIG. 1 and FIG. 8 except that the ground potential electrode part 2 is replaced with the ground potential electrode part 2C. The same sign as that in the embodiment 1 is assigned to a constituting part similar to that according to the embodiment 1 hereinafter. The description thereof is appropriately omitted, and a characteristic part of the embodiment 3 is mainly described.

As illustrated in FIG. 14 and FIG. 15, the ground potential electrode part 2C is made up of the plurality of metal electrodes 20 and an electrode dielectric film 21C.

The electrode dielectric film 21C is different from the electrode dielectric film 21, and includes a plurality of divisional gap region groups 25G in place of the plurality of gap regions 23. The plurality of divisional gap region groups 25G are disposed separately from each other along the Y direction. In this manner, in the embodiment 3, the electrode dielectric film 21C includes the plurality of divisional gap region groups 25G as a plurality of discharge area formation regions.

Each of the plurality of divisional gap region groups 25G includes a plurality of divisional gap regions 25. Each of the plurality of divisional gap regions 25 includes a partial concave region concaved from a surface thereof, and has substantially a rectangular shape in which a part of a corner part is chamfered in a plan view.

That is to say, each divisional gap region group 25G includes the plurality of partial concave regions included in the plurality of divisional gap regions 25 as the partial concave regions included in the discharge area formation region.

The plurality of divisional gap regions 25 are provided along the X direction in each of the plurality of divisional gap region groups 25G. Accordingly, each of the plurality of divisional gap region groups 25G are provided to extend in the X direction.

One gas ejection hole 22 is provided on a lower side of each of the plurality of divisional gap regions 25. That is to say, the plurality of gas ejection holes 22 pass through the electrode dielectric film 21C below the plurality of divisional gap regions 25.

As illustrated in FIG. 14, the plurality of divisional gap region groups 25G correspond to the plurality of metal electrodes 20 on a one-to-one basis. Accordingly, in the active gas generation apparatus 53 according to the embodiment 3, the plurality of metal electrodes 10, the plurality of gas supply regions 12R, the plurality of metal electrodes 20, the plurality of divisional gap region groups 25G (plurality of discharge area formation regions), and the plurality of discharge spaces 6 correspond to each other on a one-to-one basis.

Herein, in the plurality of divisional gap region groups 25G, the divisional gap region group 25G corresponding to the corresponding metal electrode 10p, the corresponding gas supply region 12Rp, the corresponding metal electrode 20p, and the corresponding discharge space 6p are defined as a corresponding divisional gap region group 25Gp (corresponding discharge area formation region).

In the corresponding divisional gap region group 25Gp, the plurality of divisional gap regions 25 and the plurality of gas supply holes 12 correspond to each other on a one-to-one basis, and the plurality of divisional gap regions 25 and the plurality of gas ejection holes 22 correspond to each other on a one-to-one basis.

Figure 16:
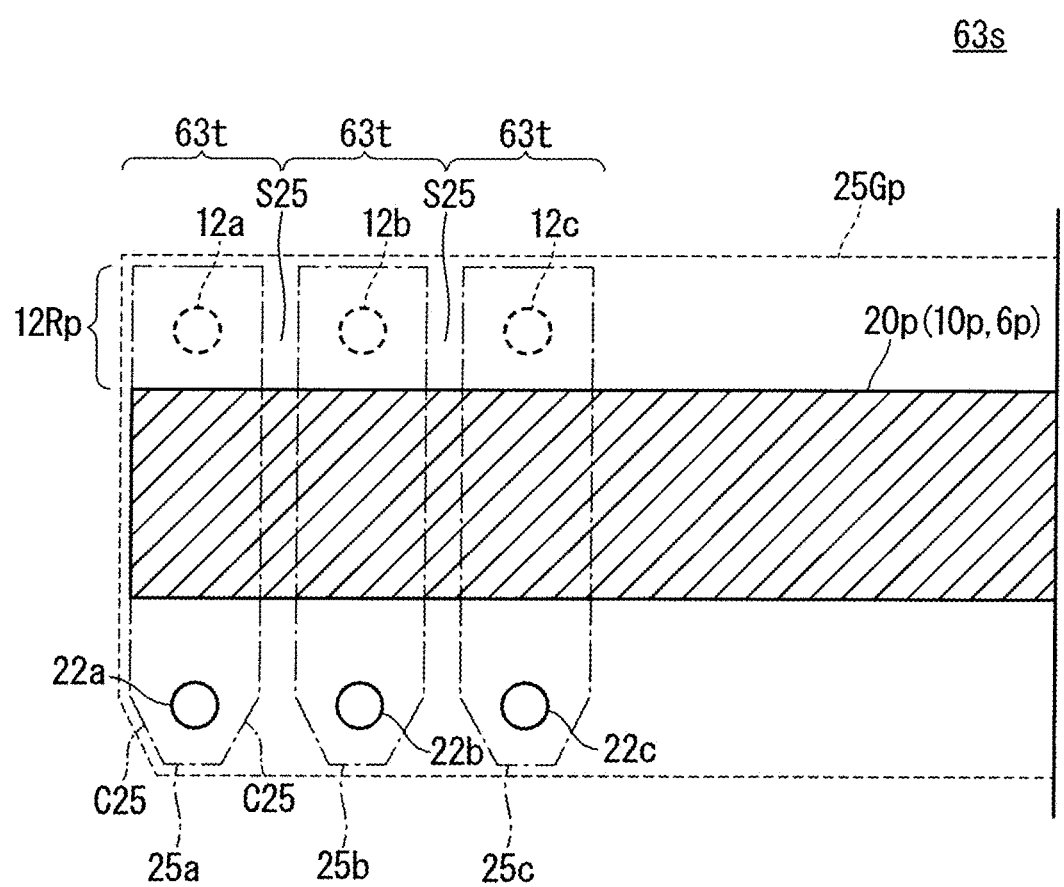
FIG. 16 An explanation diagram schematically illustrating a planar structure of one direction discharge structure according to the embodiment 3 viewed from a lower side.
Figure 16:
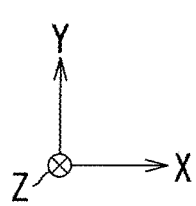

FIG. 16 is an explanation diagram schematically illustrating a planar structure of one direction discharge structure 63s viewed from a lower side. An XYZ rectangular coordinate system is illustrated in FIG. 16. Herein, "one direction discharge structure 63s" indicates a structure of one type of discharge space 6 (corresponding to one divisional gap region group 25G) and a structure around the discharge space 6 classified by a formation position in the Y direction in seven types of discharge space 6 each provided to extend in the X direction.

As illustrated in FIG. 16, in one direction discharge structure 63s, the plurality of gas supply holes 12 formed in the corresponding gas supply region 12Rp and the plurality of gas ejection holes 22 provided in the corresponding divisional gap region group 25Gp sandwich the corresponding discharge space 6p in a plan view to face each other on a one-to-one basis along the Y direction.

In the active gas generation apparatus 53 according to the embodiment 3, one divisional gap region 25 in the plurality of divisional gap regions 25 and a surrounding structure thereof constitute one unit discharge structure 63t. That is to say, one unit discharge structure 63t includes one of the plurality of divisional gap regions 25.

For example, in FIG. 16, each set of a divisional gap region 25a and a surrounding structure thereof, a divisional gap region 25b and a surrounding structure thereof, and a divisional gap region 25c and a surrounding structure thereof constitutes one unit discharge structure 63t.

As described above, the plurality of gas ejection holes 22 is provided to correspond to the plurality of divisional gap regions 25 on a one-to-one basis. Specifically, the gas ejection hole 22a is provided on a lower side of the divisional gap region 25a, the gas ejection hole 22b is provided on a lower side of the divisional gap region 25b, and the gas ejection hole 22c is provided on a lower side of the divisional gap region 25c. In this manner, one gas ejection hole 22 is provided in one unit discharge structure 63t.

An inter-gap space S25 is located between the divisional gap regions 25a and 25b and between the divisional gap regions 25b and 25c. The inter-gap space S25 is not concaved from the surface of the electrode dielectric film 21C, thus the divisional gap regions 25a to 25c are formed to be separated from each other. Accordingly, the partial concave region included in each of the divisional gap regions 25a to 25c does not interfere with each other but is a closed space. In this manner, the plurality of divisional gap regions 25 are provided separately from each other in each of the plurality of divisional gap region groups 25G.

One unit discharge structure 63t described above satisfies arrangement conditions (d) to (f) described hereinafter.

(d) One unit gas ejection hole is provided on a lower side of the divisional gap region 25 (which is one of the plurality of divisional gap regions 25), and one unit gas ejection hole described above is one of the plurality of gas ejection holes 22 provided on a lower side of the corresponding divisional gap region group 25Gp.

(e) The divisional gap region 25 (which is one of the plurality of divisional gap regions 25) and one unit gas ejection hole are overlapped with each other in a plan view, and one unit gas supply hole described above is one of the plurality of gas ejection holes 12 provided in the corresponding gas supply region 12Rp.

(f) One unit supply hole described above and one unit gas ejection hole described above sandwich the corresponding discharge space 6p in a plan view, and are disposed to face each other along the Y direction (first direction).

The condition (d) is established by reason that the plurality of divisional gap regions 25 and the plurality of gas ejection holes 22 correspond to each other on a one-to-one basis in the corresponding divisional gap region group 25Gp.

The condition (e) is established by reason that the plurality of divisional gap regions 25 and the plurality of gas supply holes 12 correspond to each other on a one-to-one basis in the corresponding divisional gap region group 25Gp.

The condition (f) is described in detail hereinafter. As illustrated in FIG. 16, the gas supply hole 12a and the gas ejection hole 22a sandwich the corresponding discharge space 6p to face each other along the Y direction in the divisional gap region 25a having the independent partial concave region. Herein, with regard to the divisional gap region 25a, the gas supply hole 12a serves as one unit gas supply hole, and the gas ejection hole 22a serves as one unit gas ejection hole.

In the similar manner, the gas supply hole 12b and the gas ejection hole 22b sandwich the corresponding discharge space 6p to face each other along the Y direction in the divisional gap region 25b, and the gas supply hole 12c and the gas ejection hole 22c sandwich the corresponding discharge space 6p to face each other along the Y direction in the divisional gap region 25c.

Herein, with regard to the divisional gap region 25b, the gas supply hole 12b serves as one unit gas supply hole, and the gas ejection hole 22b serves as one unit gas ejection hole. With regard to the divisional gap region 25c, the gas supply hole 12c serves as one unit gas supply hole, and the gas ejection hole 22c serves as one unit gas ejection hole.

A position in the X direction (coordinate) of the gas supply hole 12a is the same as that of the gas ejection hole 22a, a position in the X direction of the gas supply hole 12b is the same as that of the gas ejection hole 22b, and position in the X direction of the gas supply hole 12c is the same as that of the gas ejection hole 22c.

Furthermore, as illustrated in FIG. 16, each of the plurality of divisional gap regions 25 includes a pair of chamfered corner parts C25 made by chamfering corner parts located near the gas ejection hole 22.

The divisional gap region 25 has substantially a rectangular shape in a plan view, thus there is a possibility that the active gas 8 remains in the corner part. The pair of chamfered corner parts C25 are provided as a refining structure in the divisional gap region 25 to lead the active gas 8 to the gas ejection hole 22 as one unit gas ejection hole by the chamfered corner parts C25.

(Effect)

In the active gas generation apparatus 53 according to the embodiment 3, one direction discharge structure 63s satisfies the arrangement conditions (a) to (c) described above in the manner similar to the active gas generation apparatus 51 according to the embodiment 1, thus the active gas having the equal radical concentration can be uniformly ejected from each of all the gas ejection holes 22 provided on the lower side of the plurality of divisional gap region groups 25G.

The active gas generation apparatus 53 according to the embodiment 3 has the gas ejection hole arrangement structure described above in the manner similar to the active gas generation apparatus 51 according to the embodiment 1, thus can uniformly eject the active gas having the equal radical concentration to a whole region of the surface of the wafer 7.

Furthermore, in the active gas generation apparatus 53 according to the embodiment 3, the plurality of divisional gap regions 25 are provided separately from each other, and one unit discharge structure 63t including one divisional gap region 25 satisfies the arrangement conditions (d) to (f) described above. Thus, the material gas or the active gas does not interfere between the divisional gap regions 25 and 25 adjacent to each other in the plurality of divisional gap regions 25.

As a result, the active gas generation apparatus 53 according to the embodiment 3 can eject the active gas more uniformly from each of the plurality of gas ejection holes 22.

In addition, in the active gas generation apparatus 53 according to the embodiment 3, each of the plurality of divisional gap regions 25 includes the pair of chamfered corner parts C25 as the refining structure, thus the flow of the active gas 8 can be smoothened and the active gas 8 can be led to one unit gas ejection hole described above.

As a result, the active gas generation apparatus 53 according to the embodiment 3 can reliably suppress the inactivation of the active gas.

<Other>

The present invention has been shown and described in detail, the foregoing description is in all aspects illustrative, thus the present invention is not limited thereto. It is therefore understood that numerous modification examples can be devised without departing from the scope of the invention.

For example, in the active gas generation apparatus 53 according to the embodiment 3, the high voltage apply electrode part 1B including the plurality of high voltage side ground metal electrodes 13 may be replaced with the high voltage apply electrode part 1 in the manner similar to the active gas generation apparatus 52 according to the embodiment 2.

The invention claimed is:

1. An active gas generation apparatus generating active gas obtained by activating material gas supplied to a discharge space, comprising:
   a first electrode constituting part; and
   a second electrode constituting part provided on a lower side of the first electrode constituting part, wherein
   the first electrode constituting part includes a first electrode dielectric film and a plurality of first metal electrodes formed on an upper surface of the first electrode dielectric film,
   the second electrode constituting part includes a second electrode dielectric film and a plurality of second metal electrodes formed on a lower surface of the second electrode dielectric film, alternating voltage is applied to the plurality of first metal electrodes, and the plurality of second metal electrodes are set to have reference potential, the first electrode dielectric film includes a plurality of gas supply regions disposed along a first direction, the plurality of gas supply regions include a plurality of gas supply holes at regular intervals along a second direction, and the second direction intersects with the first direction, the plurality of first metal electrodes are disposed along the first direction, and each of the plurality of first metal electrodes is formed to extend in the second direction, the second electrode dielectric film includes a plurality of discharge area formation regions disposed along the first direction, each of the plurality of discharge area formation regions includes a concave region concaved from a surface of the second electrode dielectric film, and is provided to extend in the second direction, a plurality of gas ejection holes are provided on a lower side of each of the plurality of discharge area formation regions, and the plurality of gas ejection holes are provided at regular intervals along the second direction, the plurality of second metal electrodes are disposed along the first direction, and each of the plurality of second metal electrodes is formed to extend in the second direction, the discharge space includes a plurality of discharge spaces, the plurality of first metal electrodes, the plurality of gas supply regions, the plurality of second metal electrodes, the plurality of discharge area formation regions, and the plurality of discharge spaces correspond to each other on a one-to-one basis, a first metal electrode, a second metal electrode, a gas supply region, a discharge area formation region, and a discharge space corresponding to each other in the plurality of first metal electrodes, the plurality of second metal electrodes, the plurality of gas supply regions, the plurality of discharge area formation regions, and the plurality of discharge spaces are defined as a first corresponding metal electrode, a second corresponding metal electrode, a corresponding gas supply region, a corresponding discharge area formation region, and a corresponding discharge space, respectively, the first corresponding metal electrode, the second corresponding metal electrode, the corresponding gas supply region, the corresponding discharge area formation region, and the corresponding discharge space constitute one direction discharge structure along the second direction, and the one direction discharge structure satisfies arrangement conditions (a) to (c):

(a) a region where the first corresponding metal electrode and the second corresponding metal electrode are overlapped with each other in a plan view constitutes the corresponding discharge space in the corresponding discharge area formation region;

(b) the corresponding discharge area formation region and the plurality of gas supply holes provided in the corresponding gas supply region are overlapped with each other in a plan view; and (c) the plurality of gas supply holes provided in the corresponding gas supply region and the plurality of gas ejection holes provided below the corresponding discharge area formation region sandwich the corresponding discharge space in a plan view, and are disposed to face each other on a one-to-one basis along the first direction.

2. The active gas generation apparatus according to claim 1, further comprising a mounting part in which a processing target substrate is mounted on a lower side of the second electrode dielectric film, wherein the plurality of gas ejection holes provided on a lower side of each of the plurality of discharge area formation regions include a pair of end portion gas ejection holes located on both ends in the second direction, and the pair of end portion gas ejection holes are not overlapped with the processing target substrate in a plan view, but are disposed on an outer side of a surface of the processing target substrate in each of the plurality of discharge area formation regions.

3. The active gas generation apparatus according to claim 1, further comprising a plurality of auxiliary conductive films formed on the upper surface of the first electrode dielectric film, wherein the plurality of auxiliary conductive films are provided independently from the plurality of first metal electrodes, and are set to have the reference potential, the plurality of auxiliary conductive films correspond to the plurality of discharge area formation regions on a one-to-one basis, and the plurality of auxiliary conductive films are overlapped with the plurality of gas ejection holes provided in a corresponding discharge area formation region in the plurality of discharge area formation region in a plan view, respectively.

4. The active gas generation apparatus according to claim 2, wherein the plurality of discharge area formation regions are a plurality of gap regions in which the concave region in each of the plurality of discharge area formation regions is continuously formed in the second direction, and each of the plurality of gap regions has a refining structure of leading a flow of the active gas to the pair of end portion gas ejection holes.

5. The active gas generation apparatus according to claim 1, wherein the plurality of discharge area formation regions are a plurality of divisional gap region groups each including a plurality of divisional gap regions, each of the plurality of divisional gap regions includes a partial concave region concaved from a surface of the second electrode dielectric film, and the partial concave region includes a plurality of partial concave regions included in the plurality of divisional gap regions, the plurality of divisional gap regions are provided separately from each other, and one divisional gap region in the plurality of divisional gap regions constitutes one unit discharge structure, and the one unit discharge structure satisfies arrangement conditions (d) to (f):

(d) one unit gas ejection hole is provided on a lower side of the one divisional gap region, and the one unit gas ejection hole is one of the plurality of gas ejection holes provided on a lower side of the corresponding discharge area formation region;

(e) one unit gas supply hole is provided to be overlapped with the one divisional gap region in a plan view, and the one unit gas supply hole is one of the plurality of gas supply holes provided in the corresponding gas supply region; and (f) the one unit supply hole and the one unit gas ejection hole sandwich the corresponding discharge space in a plan view, and are disposed to face each other along the first direction.

6. The active gas generation apparatus according to claim 5, wherein each of the plurality of divisional gap regions has a refining structure of leading a flow of the active gas to the one unit gas ejection hole.

7. The active gas generation apparatus according to claim 2, further comprising a plurality of auxiliary conductive films formed on the upper surface of the first electrode dielectric film, wherein the plurality of auxiliary conductive films are provided independently from the plurality of first metal electrodes, and are set to have the reference potential, the plurality of auxiliary conductive films correspond to the plurality of discharge area formation regions on a one-to-one basis, and the plurality of auxiliary conductive films are overlapped with the plurality of gas ejection holes provided in a corresponding discharge area formation region in the plurality of discharge area formation region in a plan view, respectively.

8. The active gas generation apparatus according to claim 2, wherein the plurality of discharge area formation regions are a plurality of divisional gap region groups each including a plurality of divisional gap regions, each of the plurality of divisional gap regions includes a partial concave region concaved from a surface of the second electrode dielectric film, and the partial concave region includes a plurality of partial concave regions included in the plurality of divisional gap regions, the plurality of divisional gap regions are provided separately from each other, and one divisional gap region in the plurality of divisional gap regions constitutes one unit discharge structure, and the one unit discharge structure satisfies arrangement conditions (d) to (f):

(d) one unit gas ejection hole is provided on a lower side of the one divisional gap region, and the one unit gas ejection hole is one of the plurality of gas ejection holes provided on a lower side of the corresponding discharge area formation region;

(e) one unit gas supply hole is provided to be overlapped with the one divisional gap region in a plan view, and the one unit gas supply hole is one of the plurality of gas supply holes provided in the corresponding gas supply region; and (f) the one unit supply hole and the one unit gas ejection hole sandwich the corresponding discharge space in a plan view, and are disposed to face each other along the first direction.

9. The active gas generation apparatus according to claim 3, wherein the plurality of discharge area formation regions are a plurality of divisional gap region groups each including a plurality of divisional gap regions, each of the plurality of divisional gap regions includes a partial concave region concaved from a surface of the second electrode dielectric film, and the partial concave region includes a plurality of partial concave regions included in the plurality of divisional gap regions, the plurality of divisional gap regions are provided separately from each other, and one divisional gap region in the plurality of divisional gap regions constitutes one unit discharge structure, and the one unit discharge structure satisfies arrangement conditions (d) to (f):

(d) one unit gas ejection hole is provided on a lower side of the one divisional gap region, and the one unit gas ejection hole is one of the plurality of gas ejection holes provided on a lower side of the corresponding discharge area formation region;

(e) one unit gas supply hole is provided to be overlapped with the one divisional gap region in a plan view, and the one unit gas supply hole is one of the plurality of gas supply holes provided in the corresponding gas supply region; and (f) the one unit supply hole and the one unit gas ejection hole sandwich the corresponding discharge space in a plan view, and are disposed to face each other along the first direction.

* * * * *